(12) United States Patent
Shiode

(10) Patent No.: US 7,193,713 B2
(45) Date of Patent: Mar. 20, 2007

(54) METHOD AND APPARATUS FOR MEASURING OPTICAL CHARACTERISTIC, AND PROJECTION EXPOSURE APPARATUS USING THE SAME

(75) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 323 days.

(21) Appl. No.: 10/692,438

(22) Filed: Oct. 22, 2003

(65) Prior Publication Data

US 2004/0156041 A1 Aug. 12, 2004

(30) Foreign Application Priority Data

Oct. 22, 2002 (JP) ............... 2002-307333

(51) Int. Cl.
*G01B 11/00* (2006.01)

(52) U.S. Cl. ..................... 356/399

(58) Field of Classification Search ........ 356/399–401, 356/124; 250/548; 355/53, 55, 77
See application file for complete search history.

(56) References Cited

U.S. PATENT DOCUMENTS

| | | | | |
|---|---|---|---|---|
| 5,184,196 A | * | 2/1993 | Nakagawa et al. | 356/401 |
| 5,331,369 A | * | 7/1994 | Terasawa et al. | 355/53 |
| 5,828,455 A | * | 10/1998 | Smith et al. | 356/515 |
| 5,925,887 A | * | 7/1999 | Sakai et al. | 250/548 |
| 5,978,985 A | | 11/1999 | Thurman | |
| 6,833,906 B1 | * | 12/2004 | Ohsaki | 355/69 |
| 2002/0015158 A1 | * | 2/2002 | Shiode et al. | 356/614 |
| 2002/0021434 A1 | | 2/2002 | Nomura et al. | |
| 2003/0133099 A1 | | 7/2003 | Shiode | |
| 2003/0197865 A1 | | 10/2003 | Shiode | |

FOREIGN PATENT DOCUMENTS

| | | |
|---|---|---|
| JP | 2001-230193 | 8/2001 |
| WO | WO 02/052620 | 7/2002 |

OTHER PUBLICATIONS

Japanese Official Action, dated Feb. 21, 2006, for counterpart JP Application No. 2002-307333 (with partial English translation).
English Abstract of JP 2001-230193 (Item 9).

* cited by examiner

*Primary Examiner*—Gregory J Toatley, Jr.
*Assistant Examiner*—Isiaka O. Akanbi
(74) *Attorney, Agent, or Firm*—Morgan & Finnegan, L.L.P.

(57) ABSTRACT

Disclosed is a method and apparatus for measuring an optical characteristic of a projection optical system such as wavefront aberration, for example, very precisely. In an embodiment of the present invention, the method includes a first detecting step for causing each of plural light beams from a pattern to pass a predetermined position on a pupil plane of the optical system and subsequently imaging the light beams separately, and for detecting an imaging position of each light beam upon the pupil plane of the optical system, a second detecting step for detecting error information related to a passage position as each light beam passes through the pupil plane, and a third detecting step for detecting wavefront aberration of the optical system on the basis of the imaging position of each light beam upon the pupil plane and of the error information related to the passage position of each light beam on the pupil plane.

16 Claims, 21 Drawing Sheets

TPb

TPb

METHOD AND APPARATUS FOR MEASURING OPTICAL CHARACTERISTIC, AND PROJECTION EXPOSURE APPARATUS USING THE SAME

FIELD OF THE INVENTION AND RELATED ART

This invention relates to a method and an apparatus for measuring an optical characteristic of an optical system. More particularly, the invention concerns a method and an apparatus for measuring an optical characteristic of a projection optical system, such as wavefront aberration, for example, of a projection exposure apparatus to be used in a lithographic process in the manufacture of semiconductor devices, liquid crystal display devices, thin-film magnetic heads, or the like.

The production of various devices such as semiconductor devices, liquid crystal display devices, thin-film magnetic heads, or the like, based on a lithographic process, uses a projection exposure apparatus which projects an image of a device pattern of a reticle or photomask (hereinafter, generally "reticle") onto a photosensitive substrate through a projection optical system. In such projection exposure apparatus, a decrease of resolving power of the device pattern caused by aberration of the projection optical system, which results from manufacturing errors or the like, raises a critical problem.

In order to meet this, aberration measurement methods have been developed to measure various aberrations of a projection optical system such as spherical aberration, field curvature, astigmatism, comatic aberration, wavefront aberration including components of these four aberration, and so on. These measurement methods are used for evaluation or inspection of projection optical systems. Among these aberrations, the wavefront aberration is very the aberration that the projection optical system itself bears. For this reason, in many cases, the wavefront aberration is measured on the basis of approximation, being based on Zernike polynomial or the like, and then spherical aberration, field curvature, astigmatism, comatic aberration and so on, which are factors of the polynomial, are calculated.

U.S. Pat. Nos. 5,828,455 and 5,978,085 show an example of method of measuring wavefront aberration of a projection optical system. According to this method, a grid-like pattern is formed on a pattern bearing surface (bottom face) of a reticle, and a light blocking plate having a pinhole is provided just below the center of the grid-like pattern, with a small clearance held therebetween. Further, a special test reticle having a convex lens disposed just above the center of the grid-like pattern, is prepared upon the reticle top surface. This test reticle is placed on a reticle stage of an exposure apparatus. Illumination light from an illumination system is collected by the convex lens of the test reticle, and the colleted light is then projected on the grid pattern below it, at an illumination angle (NA) having a (coherence factor) not less than 1. Predetermined light beams of the light from the grid pattern pass the pinhole below it. The light which can pass through the pinhole is limited to those light beams having an angle connecting the pinhole and the center of each pattern of the grid pattern. In other words, the light beams emitted from different points on the grid pattern advance while defining different angles with respect to the optical axis, and they pass through different positions upon the pupil plane of the projection optical system. Then, after being influenced by the wavefront aberration of the projection optical system, these light beams impinge on a wafer, and the different points of the grid pattern are imaged there.

Here, as regards images of respective points of the grid pattern, the imaging position shifts from an idealistic position and along the image plane, by an amount corresponding to the tilt, from an idealistic wavefront, of the wavefront of the point-imaging light beams having been influenced by aberrations (phases) which are different in dependence upon the passage position on the pupil plane. Hence, by measuring deviations of respective points of the imaged grid pattern from idealistic grating points, the tilt of the wavefront of the light beams, imaging the points, can be detected and, thus, the wavefront aberration can be calculated by arithmetical methods, from the tilt of the wavefront of the light beams.

SUMMARY OF THE INVENTION

According to investigations made by the inventor of the subject application, it has been found that, in the above-described method, the wavefront aberration can not be calculated with good precision because of an error produced in respect to the position of the pupil center which is used in calculation of the wavefront aberration. The term "pupil center" refers to the point where the pupil plane of a projection optical system and the optical axis of the projection optical system intersect with each other. The wavefront aberration calculation is carried out on an assumption that the light beam which images the center point, among plural points on the grating pattern of the reticle, passes the pupil center (coordinates (0,0)) which is predetermined by calculation, while light beams from the other points pass predetermined positions (coordinates (Xi,Yi) which are respectively spaced from the pupil center. In the actual measurement, on the other hand, the light beam for imaging the center point passes a position deviated from the pupil center, and also the other light beams pass positions deviated from the predetermined positions, such that there is substantial positional deviation (error) on the pupil plane. Such phenomenon may be caused by a deviation between the central point (position) of the grid pattern (pattern group) of the reticle and the center (position) of the pinhole just below it, in a direction perpendicular to the optical axis, which deviation may attribute to a manufacturing error, or it may be caused by tilt of the optical system of the projection optical system.

It is accordingly an object of the present invention to provide a method and apparatus which enables high-precision measurement of an optical characteristic (such as wavefront aberration) of a projection optical system.

In accordance with an aspect of the present invention, there is provided a method of measuring an optical characteristic, which method comprises: a first detecting step for causing each of plural light beams from a pattern to pass a predetermined position on a pupil plane of the optical system and subsequently imaging the light beams separately, and for detecting an imaging position of each light beam upon the pupil plane of the optical system; a second detecting step for detecting error information related to a passage position as each light beam passes through the pupil plane; and a third detecting step for detecting wavefront aberration of the optical system on the basis of the imaging position of each light beam upon the pupil plane and of the error information related to the passage position of each light beam on the pupil plane.

In accordance with another aspect of the present invention, there is provided a method of measuring an optical characteristic of an optical system, which method comprises: a first detecting step for causing each of plural light beams from a pattern to pass through a pupil plane of the optical system and subsequently causing the light beams to interfere with each other and imaging them, and for detecting an imaging position upon the pupil plane of the optical system; a second detecting step for detecting error information related to a passage position as each light beam passes through the pupil plane; and a third detecting step for detecting wavefront aberration of the optical system on the basis of the imaging position of each light beam upon the pupil plane and of the error information related to the passage position of each light beam on the pupil plane.

The present invention provides a method and apparatus for measuring an optical characteristic of a projection optical system, such as wavefront aberration, for example, very precisely.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
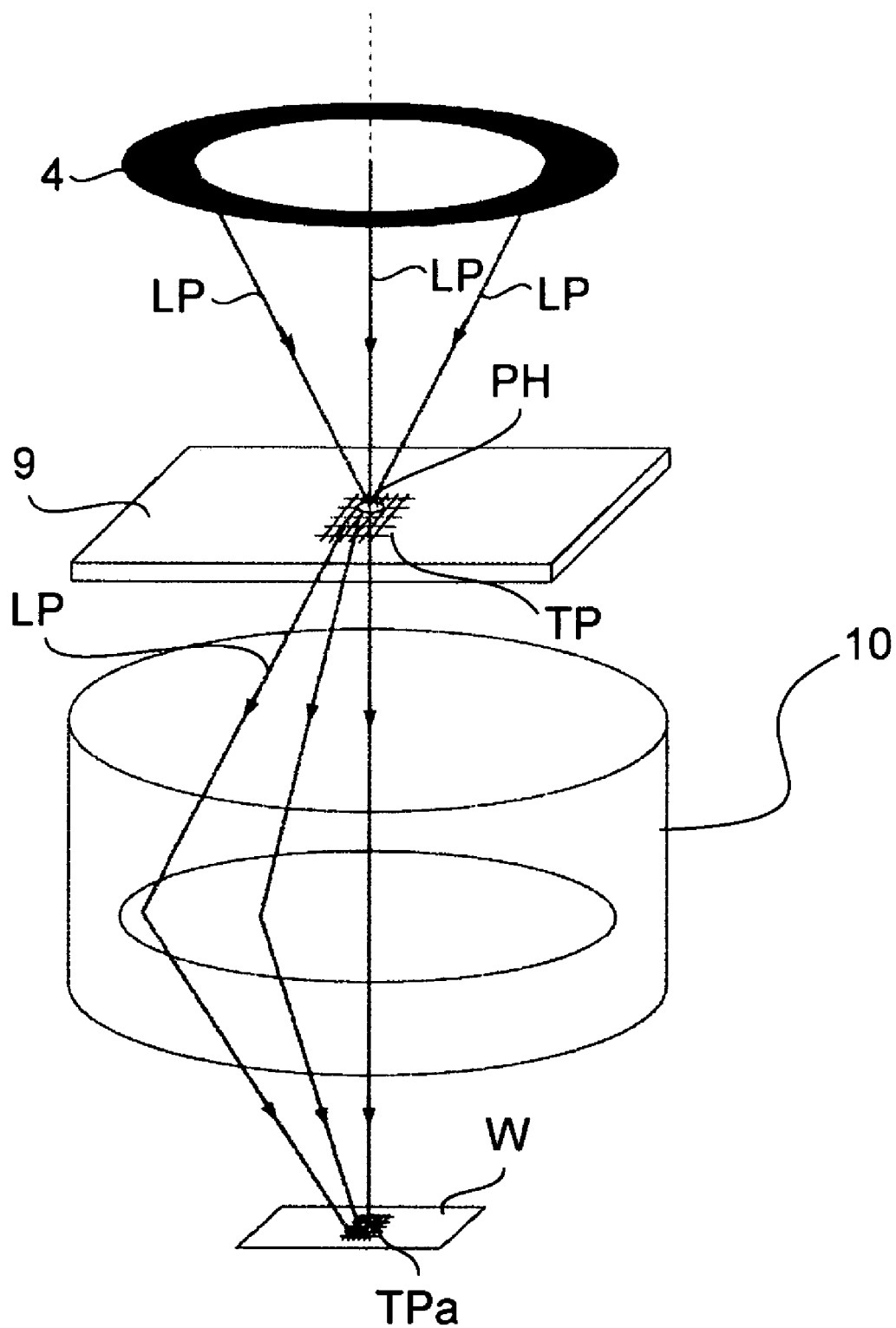
FIG. 1 is a schematic view for explaining an example of a method of measuring wavefront aberration of a projection optical system.

FIG. 1 is a schematic view for explaining a measurement method which is a basic procedure in an optical characteristic measuring method according to the present invention. Specifically, Figure is a fragmentary and schematic illustration of a projection exposure apparatus which is used in a lithographic process in the semiconductor device manufacturing procedure. For production of semiconductor devices, a circuit pattern formed on a reticle is projected on a photosensitive substrate W through a projection optical system 10. Here, FIG. 1 illustrates the state in which a test reticle 9 for wavefront aberration measurement is loaded on the exposure apparatus. By the way, in addition to a circuit pattern, a reticle having formed thereon a specific pattern for measurement of an optical characteristic such as wavefront aberration, for example, may be used as a test reticle.

The test reticle 9 comprises a test pattern (mark) group TP which is formed on a pattern bearing surface of a glass substrate, facing to the projection optical system 10, and a light blocking film (its light blocking portion being unshown) which is formed on a surface of the glass substrate, on the opposite side of the pattern bearing surface, and which has a pinhole HP therein. In this example, the test pattern PT and the pinhole PH are formed on the top and bottom surfaces of one and the same substrate, respectively. However, the pinhole PH may be formed on another glass substrate, separate from the glass substrate having the test pattern TP, and theses glass substrates may be disposed in close proximity to each other. The test pattern TP comprises patterns each being constituted by a special diffraction grating mark arranged so that, substantially, first-order diffraction light is not produced but the pattern imaging is accomplished by zero-th order (diffraction) light only. Details of such test reticle having special diffraction grating patterns discussed above are disclosed in Japanese Patent Application Nos. 10-307981 and 10-307945, filed by the same assignee of the subject application. Special diffraction grating marks described above are illuminated with light from the pinhole PH placed above the grating pattern and having a pinhole just above the center of the test pattern 10, the grating marks being illuminated in different directions, respectively. Each mark is then imaged upon the photosensitive substrate W through the projection optical system, on the basis of zero-th order light. Then, the imaging position is detected.

Denoted at 4 is an aperture stop of an illumination optical system. The illumination light including a plurality of principal rays LP irradiates the pinhole PH through the aperture stop 4, with an NA (angular expansion) corresponding to σ>1 or σ=1. Here, the principal ray LP refers to the light ray which is emitted from the pupil plane of the illumination optical system and which passes the center of the pattern surface of the test reticle 9, that corresponds to the Fourier transform plane in respect to the pupil plane. Further, σ (sigma) is the ratio between the NA of the illumination optical system and the NA of the projection optical system, and it is expressed by σ="NA of illumination optical system"/"NA of projection optical system".

The principal rays passing through the pinhole PH illuminate the pattern group TP formed on the bottom face of the glass substrate of the test reticle 9, whereby patterns of the pattern group TP are imaged upon the image plane through the projection optical system 10. Aerial image TPa at the image plane may be received by a photoelectric converting element. Alternatively, the photosensitive substrate W may be placed at the image plane so that each pattern image may be transferred thereto and then developed, whereby a transferred pattern image TPa may be formed. The position of the aerial image TPa or of the transferred pattern image TPa is then measured by use of a position measuring device. Subsequently, a deviation of the measured position from a reference position is detected and, by calculation based on the result of detection, the wavefront of the projection optical system (in this example, Zernike polynomial) is detected.

As regards the above-described diffraction grating mark which constitutes the test pattern TP, it is a periodic pattern of lines and spaces having substantially regular pitches (intervals) between lines or spaces. Also, it is a pattern in which the widths of individual spaces through which the light can pass are decreasing, in a direction from the central line or space of the diffraction grating mark to the outside pattern of the diffraction grating mark. The widths and pitches of the lines and spaces are so set that, by reducing higher order diffraction lights, substantially no first-order diffraction light is produced but only zero-th order (diffraction) light is produced.

Further, in order that this pattern TP can be regarded as a single line at least upon the image plane, the widths and pitches of the lines and spaces are set such that the light intensity distribution of the pattern image, as the test pattern TP is imaged by the projection optical system 10, can be a distribution in which adjacent lines inside thereof are not resolved and in which the distortion is small.

Now, a first embodiment of the present invention in which a method of measuring an optical characteristic such as wavefront aberration, for example, as described above, will be explained.

Figure 2:
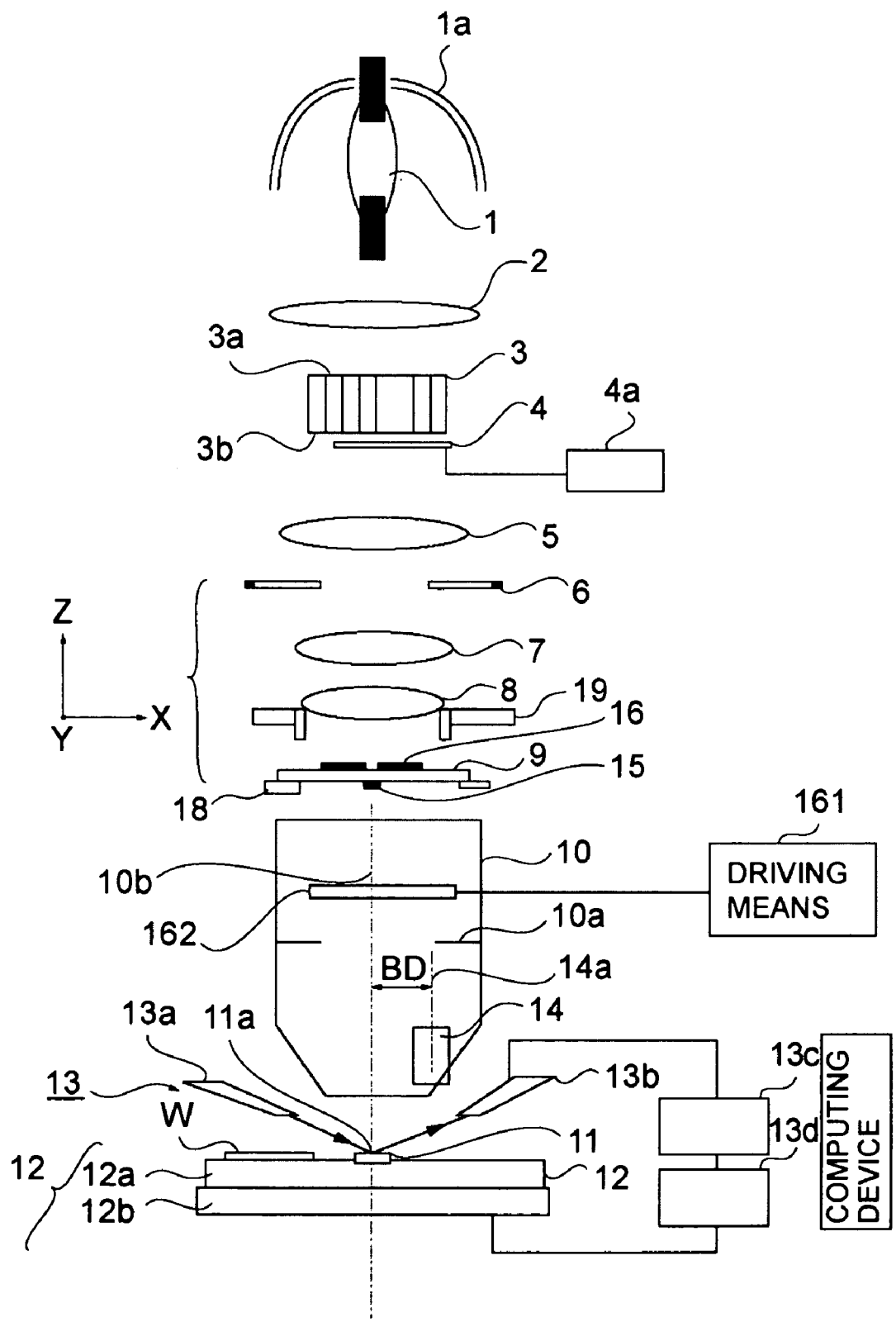
FIG. 2 is a schematic and diagrammatic view of an exposure apparatus according to an embodiment of the present invention.

FIG. 2 is a schematic view of a projection exposure apparatus according to a first embodiment of the present invention. In this exposure apparatus, the wavefront of a projection optical system was measured during the manufacturing stage of the exposure apparatus in accordance with a method (to be described later) and necessary aberration adjustment was carried out. Further, even after the manufacture, in the periodic maintenance of the apparatus the wavefront aberration of the projection optical system is measured in accordance with a method to be described later, and necessary aberration adjustment, if any, is carried out. A device pattern formed on the surface of a reticle is lithographically transferred to a wafer by use of this exposure apparatus and through the projection optical system. After the exposed wafer is developed and, through subsequent processes, device are produced.

In FIG. 2, denoted at 1 is an ultra-high pressure Hg lamp which is a light source for providing exposure light. The exposure light emitted from the Hg lamp 1 is collected by an elliptical mirror 1a and, subsequently, the light enters a light entrance surface 3a of a fly's eye lens 3. At a rear focal plane 3b of the fly's eye lens 3 (at a side facing to the test reticle 9), a secondary light source is produced. The exposure light emitted from this secondary light source goes through an aperture stop 4, a fist relay lens 5, a projection type reticle blind 6, a second relay lens 7, and a main condenser lens 8, and it illuminates a test reticle 9 with uniform illuminance. The aperture diameter and aperture shape of the aperture stop 4 are made changeable.

The exposure light source is not limited to the ultra-high pressure Hg lamp 1. Various light sources to be used in a semiconductor exposure apparatus, such as KrF excimer laser (wavelength is about 248 nm), ArF excimer laser (wavelength is about 193 nm), or F2 laser (wavelength is about 157 nm).

The opening of the projection type reticle blind 6 and the pattern bearing surface of the test reticle 9 are optically conjugate with each other. Thus, by the opening of the projection type reticle blind 6, an illumination region is defined on the test reticle 9. Further, the rear focal surface of the fly's eye lens 3 is approximately conjugate with the pupil plane 10a of the projection optical system 10, and an image of the secondary light source is formed on the pupil plane 10a.

The test reticle 9 is placed on a reticle stage 18. By moving the reticle stage 18 along the X-Y plane, the position of the test reticle 9 can be changed. An alignment scope 19 can operate to observe an alignment mark on the test reticle 9 and a reticle reference mark provided inside the exposure apparatus main assembly, simultaneously, thereby to measure a deviation of the mark of the test reticle 9 with respect to the reticle reference mark in X and Y directions and in rotational angle θ. Thus, by moving the reticle stage through a driving system (not shown), the reticle 9 can be brought into alignment with respect to the exposure apparatus main assembly (projection optical system 10).

Denoted at 14 is an off-axis type wafer alignment system. The off-axis wafer alignment system 14 operates to detect alignment marks formed adjacent to shot regions on the wafer W. Here, by detecting the interval between the optical axis 14a of the wafer alignment system 14 and the optical axis 10b of the projection optical system 10, that is, what is called "base line length" BD beforehand, each shot region of the wafer 11 can be aligned accurately with the circuit pattern (image) of the reticle on the basis of the positions of some alignment marks having been measured by use of the wafer alignment system 14.

The alignment scope 19 can be moved to any arbitrary position (arbitrary X-Y position) upon the test reticle 9, through the driving system described above. For measurement of wavefront aberration, it can illuminate an arbitrary measurement test pattern 15 on the reticle 9. Further, also the illumination system can illuminate an arbitrary measurement test pattern 15 on the reticle 9, with the exposure light and through the opening of the reticle blind 6.

The reticle 9 has formed, on its upper surface, a light film 16 having a pinhole PH. When the pinhole PH on the upper surface of the test reticle is illuminated with the illumination system for exposure or with the alignment scope 19, the light passing through the pinhole 16 illuminates the test pattern 15 formed on the bottom surface of the test reticle 9 under a condition σ≧1. The patterns (diffraction grating marks) of the illuminated test pattern 15 are imaged by the projection optical system 10, upon the wafer W placed on the wafer stage 12 or a plate 11a which constitutes a detection system 11.

Figure 3:
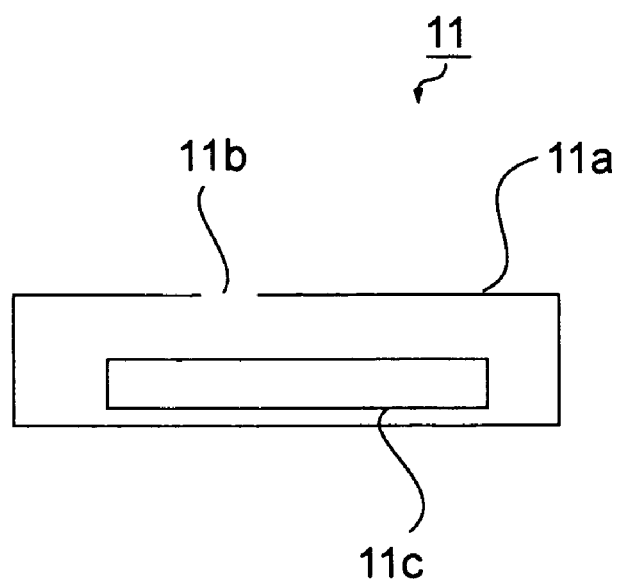
FIG. 3 is an enlarged and schematic view for explaining a detection system 11 shown in FIG. 2.

FIG. 3 is an enlarged view of the detection system 11 of FIG. 2.

Figure 4:
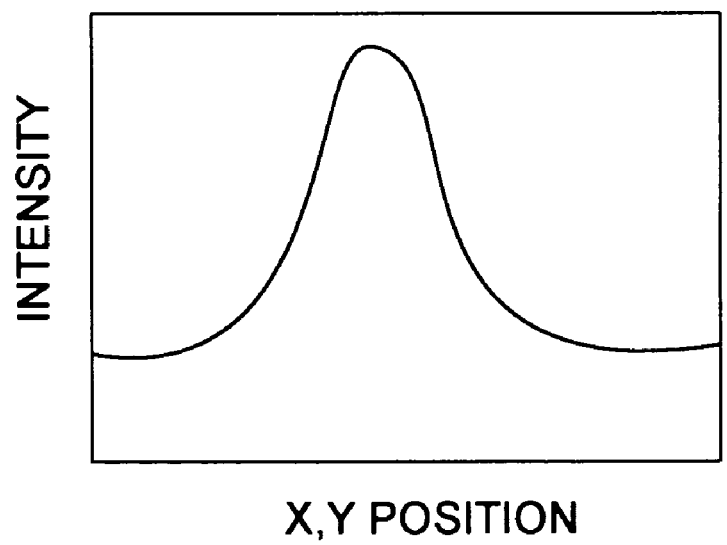
FIG. 4 is a graph for explaining a light intensity distribution of a mark image to be detected by the detection system 11 shown in FIG. 2.

The plate 11a is formed with a slit 11b. Normally, the top surface of the plate 11a is registered with the image plane, and light passing through the slit 11b is photoelectrically converted by a photoreceptor 11c. At this time, the detection system 11 is scanningly moved along the image plane by the wafer stage 12, whereby the pattern image is converted into an electric signal such as shown in FIG. 4, for example. Then, the pattern image (the position thereof) is detected.

The wafer stage 12 includes an X-Y stage 12b for positioning the wafer or the detection system 11 at an arbitrary position along the X-Y plane which is perpendicular to the optical axis 10b of the projection optical system 10, and a Z stage 12a for setting the position of the wafer W or of the detection system 11 with respect to the optical axis 10b direction (height direction) of the projection optical system 10, and so on.

There is an autofocus system 13 for detecting the position of the wafer W or of the detection system 11 with respect to the optical axis direction of the plate 11a. The autofocus system 13 comprises a light supplying system 13a for projecting an image of a slit-like detection pattern, for example, onto the plate 11a of the detection system 11, obliquely with respect to the optical axis 10b of the projection optical system 10, as well as a light receiving system 13b which receives reflection light from the wafer W or from the plate 11a top surface and re-images the image of its detection pattern, thereby to detect the position thereof.

If there occurs a change in the position of the plate 11a or wafer W with respect to the height direction and relative to the image plane of the projection optical system 10, in the light receiving system it causes a change in the position of the re-imaged image of the detection pattern. Thus, by detecting the position of this pattern image, any change in height of the plate 11a or wafer W can be detected.

The light receiving system 13b has a photoelectric detector 13c, incorporated therein, for producing a focus signal which is changeable with the position of the re-imaged detection pattern image. By moving the Z stage 12a of the wafer stage 12 through a control system 13d so as to keep the focus signal of the photodetector at a predetermined level, the top surface of the plate 11a or the surface of the wafer W can be registered with the image plane of the projection optical system 10, and this state can be held as well. Further, since the focus signal changes substantially linearly with a positional change of the plate 11a in the height direction within a predetermined range (a predetermined range in the optical axis direction), by using the autofocus system and the driving system the top surface of the plate 11a or the surface of the wafer W can be set at an arbitrary position (surface position) which is different from the image plane of the projection optical system 10.

Figure 5A:
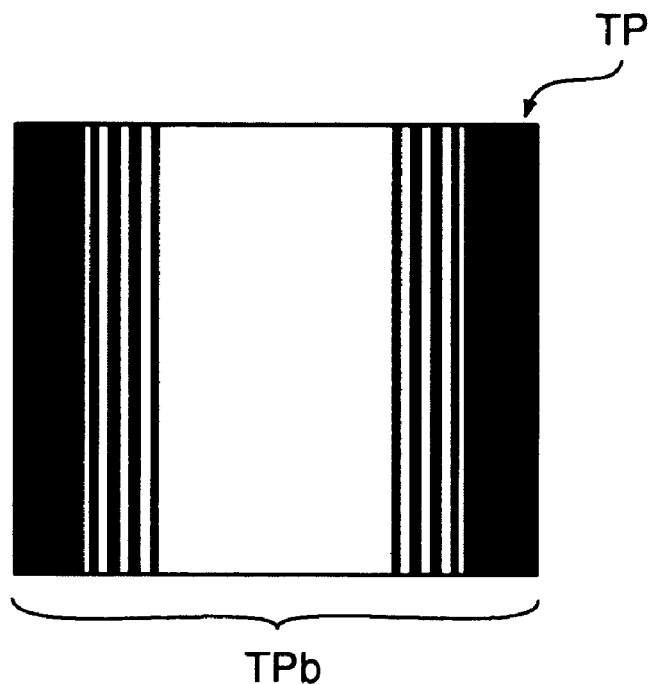
FIGS. 5A and 5B each illustrates an example of a test pattern according to the present invention.
Figure 5B:
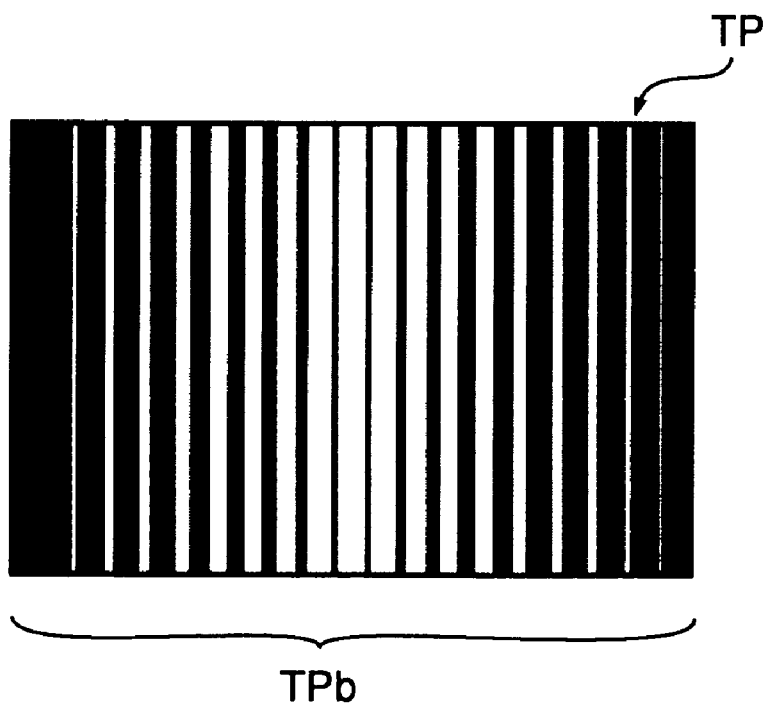
Figure 6:
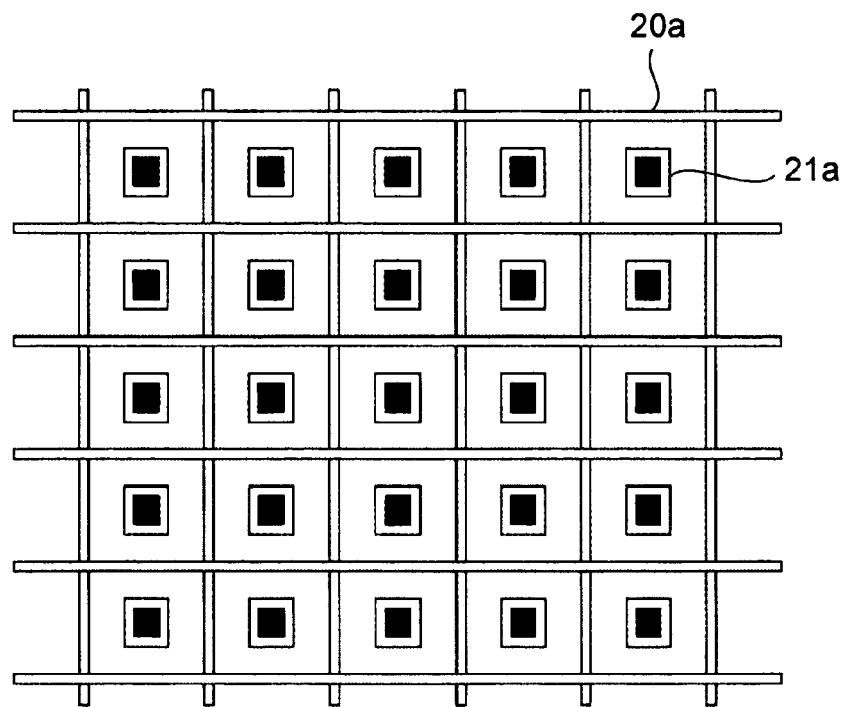
FIG. 6 is a schematic view for explaining a state in which test patterns according to the present invention are superposedly exposed.
Figure 7:
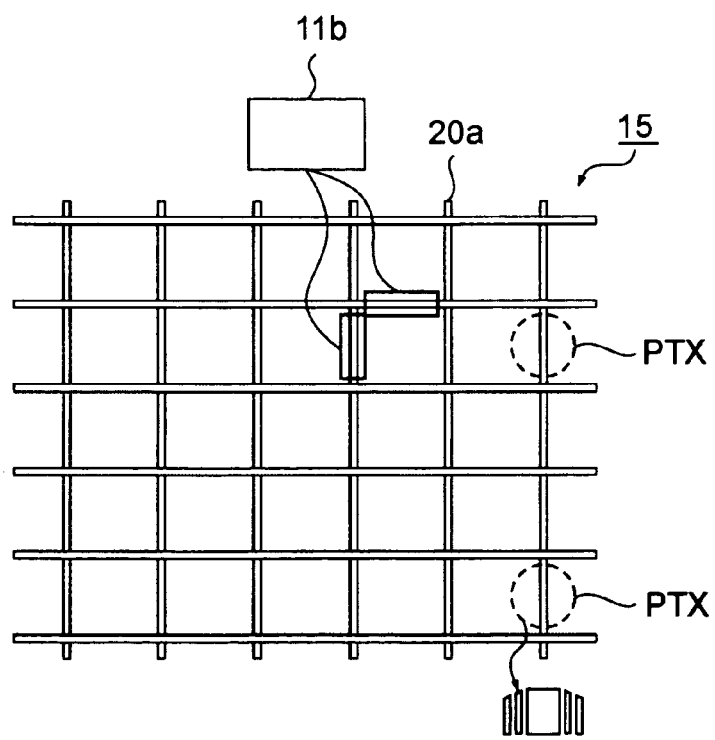
FIG. 7 is a schematic view for explaining a grid which constitutes a test pattern according to the present invention.

FIG. 7 shows details of a test pattern 15 to be provided on the test reticle 9. In FIG. 7, denoted at 20a is a mark of the test pattern to be used. The mark 20a generally has a grid-like shape formed within a range that can be regarded as one image height of the optical system 10. Each of many portions PTX and PTY (not shown) thereof comprises a diffraction grating mark having a shape, such as shown in FIG. 5A or 5B, that does not substantially produce ±1st order (high-order) diffraction light.

The longitudinal and lateral lines constituting the grid of the mark 20a of FIG. 7 are all designed with the same linewidth of 2 μm. Although there is no particular restriction in regard to the width of the lines of the mark 20a, preferably, it should be determined appropriately while taking into account the pattern dependency of the detector 11 or a measuring device for measuring the transfer pattern.

In the test reticle 9 used in the first embodiment, there are marks 20a such as shown in FIG. 7, formed at a plurality of locations (corresponding to the plural image heights of the projection optical system) on the bottom surface of the glass substrate. Also, there are light blocking films with pinholes 16 at positions, on the top surface of the glass substrate, which correspond to the centers of the marks 20a, respectively. For illumination of the marks 20a, either the above-described exposure illumination system or the alignment scope 19 is used. If they can not supply illumination light with a equal to or greater than 1.0, a test reticle 9 (FIG. 9) having a scattering plate (diffusion plate) 22 disposed on the pinhole PH is used so as to enable illumination of the mark 20a with σ≧1.0. The scattering plate scatters the exposure light to produce an illumination condition σ≧1.0, so that all the marks necessary for the optical measurement are illuminated with illumination light in mutually different directions.

Figure 9:
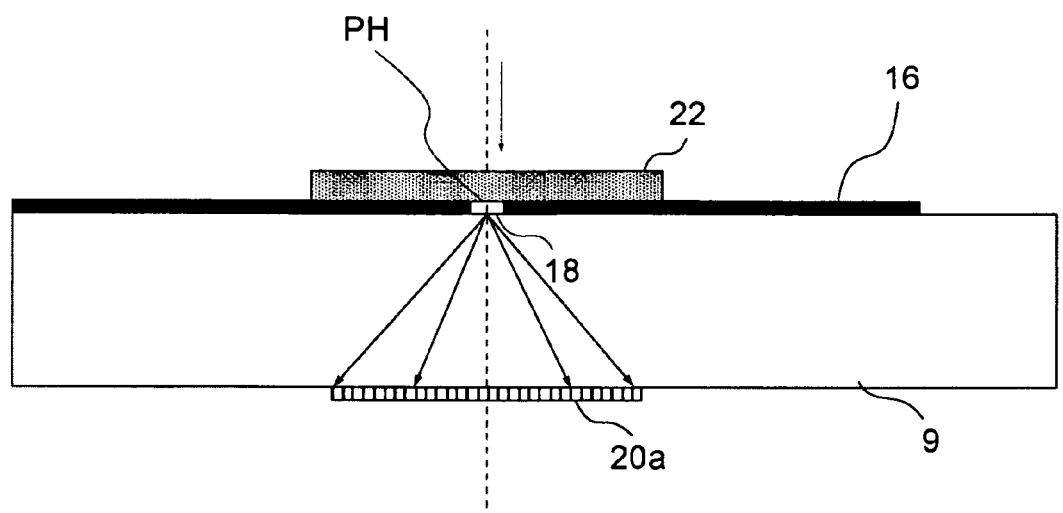
FIG. 9 is a sectional view for explaining an example of a test reticle according to the present invention.

For example, by illuminating the test reticle shown in FIG. 9 with exposure light, patterns TPX and TPY of the mark 20a of the test reticle corresponding to one image height are imaged by the projection optical system 10 upon the plate 11a on the wafer stage 12. In relation to each of the patterns TPX and TPY, the wafer stage 12 is moved along the X-Y plane so that the slit 11b provided on the plate 11a is scanningly moved along the image plane and relative to the pattern image, whereby a light intensity (light quantity) distribution of the pattern image is detected as an output change of the photoreceptor 11c. On the basis of the thus detected light intensity distribution, computing means is used to detect the central positions (X,Y) of the images of the patterns PTX and PTY. From the thus determined central positions of the pattern images in one image height as well as coordinates of the lights, imaging these patterns, with respect to the pupil plane of the projection optical system 10, and so on, the computing means calculates tilt of the wavefront of each light and determines the wavefront aberration of the projection optical system, with respect to a certain image height. Since the test reticle 9 is formed with marks 20a corresponding to different image heights as described hereinbefore, the above-described measurement may be repeated by using other marks 20a corresponding to other image heights to be measured, whereby wavefront aberrations in relation to all necessary image heights can be detected.

As regards the width of the slit 11b, as shown in FIG. 7, it has a length and width not greater than the pitch of the aerial image of the grid of the test pattern 15, the width being determined so as to prevent entry, into the slit 11b, of light from any image other than the image of the one pattern TPX to be measured. Further, as shown in FIG. 7, it is necessary that a longitudinal slit and a lateral slit are set separately in relation to the pattern images of a longitudinal line and a lateral line of the grid of the test pattern 15. In order to meet this, the detector 11 may be arranged so that a single slit 11c is made rotatable at least by 90 deg. or, alternatively, it may have a pair of slits extending in mutually orthogonal directions and different photoreceptors 11c corresponding to theses slits. Anyway, in accordance with longitudinal or lateral orientation of the pattern image 20a to be measured, the direction of the slit can be interchanged to accomplish the measurement.

In the first embodiment, the wavefront aberration measurement described above is carried out plural times while changing the position of the top surface of the plate 11a of the detector 11 with respect to the optical axis direction (e.g. successively changing by 1 μm). For each optical axis direction (defocus position), the central positions of the pattern images (diffraction grating mark images) of the test pattern 15 are detected. In accordance with the method to be described later, a positional deviation (error) of the pupil plane of the projection optical system 10 in terms of calculation, is calculated and stored as a system error, and the wavefront aberration calculated so as to correct this error.

Figure 11:
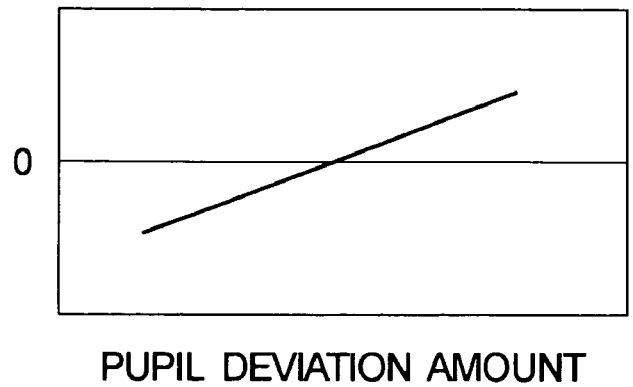
FIG. 11 is a graph for explaining the relationship between wavefront aberration versus defocus amount, in relation to pupil deviation.
Figure 13:
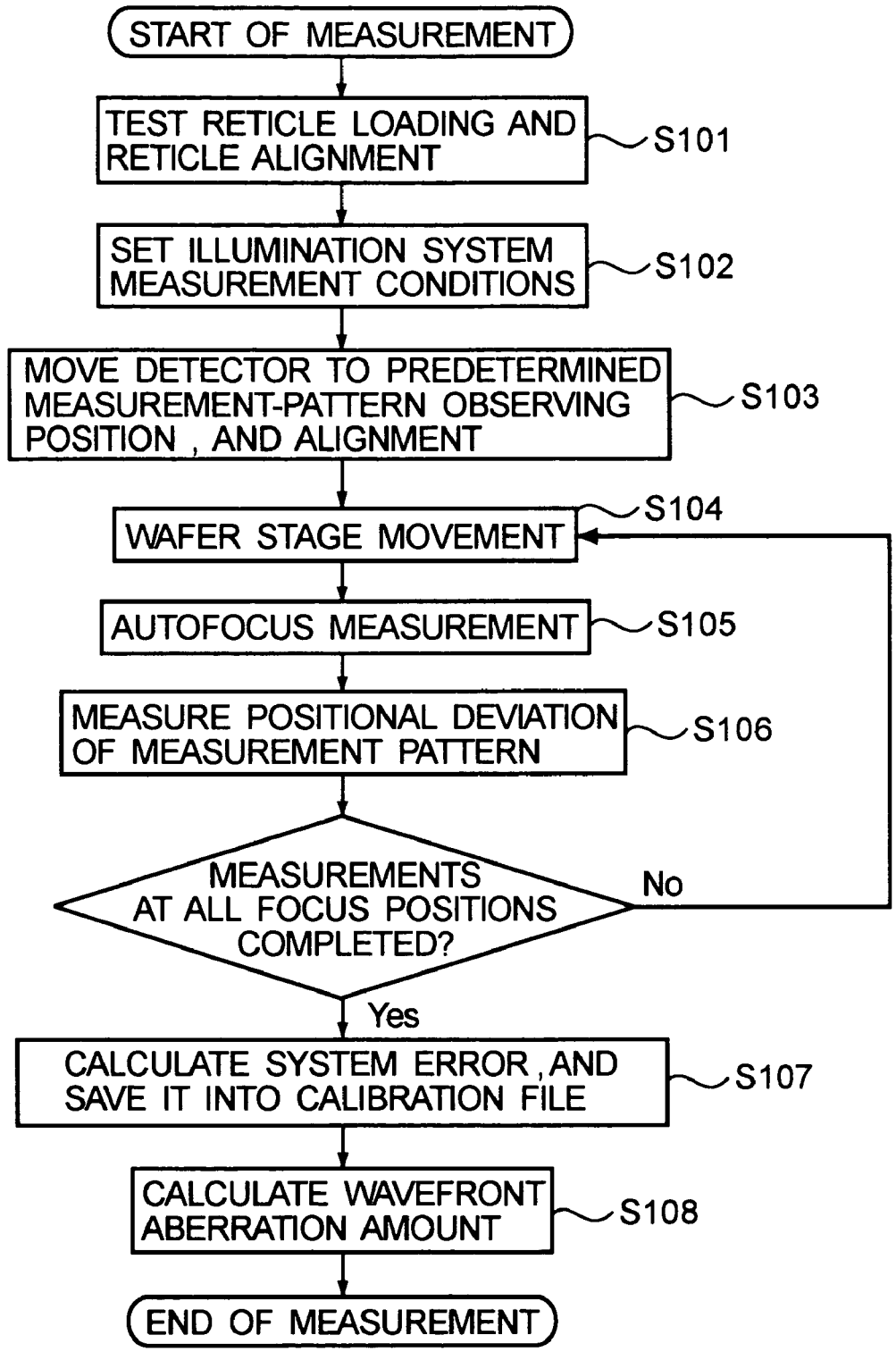
FIG. 13 is a flow chart for explaining an example of aberration measurement for a projection optical system, according to the present invention.

If the wavefront aberration is measured while changing, a little bit, the position (defocus position) of the plate 11a top surface with respect to the optical axis direction, idealistically only the spherical aberration term of the wavefront (Zernike polynomial) is influenced thereby and changes. However, if the position (central position) of the pupil plane at the time of wavefront aberration measurement is deviated from the position (central position) of the pupil plane as hypothesized in terms of calculation and thus there is an error produced in the passage position on the pupil plane 10a of the lights, imaging the patterns, then terms of aberrations other than the spherical aberration are also influenced thereby. Hence, by using the computing means shown in FIG. 2, for example, data such as shown in FIG. 11 that represents the interrelationship between the pupil plane positional deviation amount and changes of aberration other than the spherical aberration, may be prepared. On the basis of this data, the pupil plane positional deviation amount can be detected. FIG. 13 illustrates the sequential flow for detecting the positional deviation (error) of the pupil plane as a system error, described above.

In FIG. 13, as the measurement starts, a test reticle 9 having a test pattern 15 formed thereon is loaded on the reticle stage 18, and thereafter alignment of the test reticle 9 and the reticle stage 18 is carried out (S101). Subsequently, various illumination conditions for illuminating the test reticle 9 are set (S102). Then, the detector 11 is moved to a predetermined measurement-pattern observing position, and alignment thereof is carried out (S103). Then, the wafer stage 12 is moved (S104), and the position with respect to the optical axis direction of the projection optical system 10 is measured (S105). Thereafter, measurement of the positional deviation amount of the image of the test reticle pattern 9 is carried out in the manner as described hereinbefore (S106).

By repeating the procedure at S104–S106 while changing the position of the wafer stage with respect to the height direction, the measurement is carried out. When measurements for all the positions are completed, the system error (positional deviation amount of pupil plane) is calculated on the basis of the positional deviation measurement results thus obtained, and the detected error is stored as a calibration file (S107). Then, on the basis of the calculated system error, the positional deviation amount of the pupil plane is corrected, and thus the wavefront aberration of the projection optical system is calculated (S108).

Figure 12:
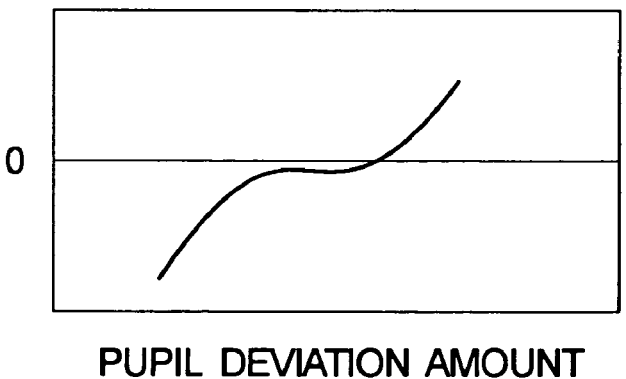
FIG. 12 is a graph for explaining the relationship between wavefront aberration versus predetermined aberration, in relation to pupil deviation.
Figure 14:
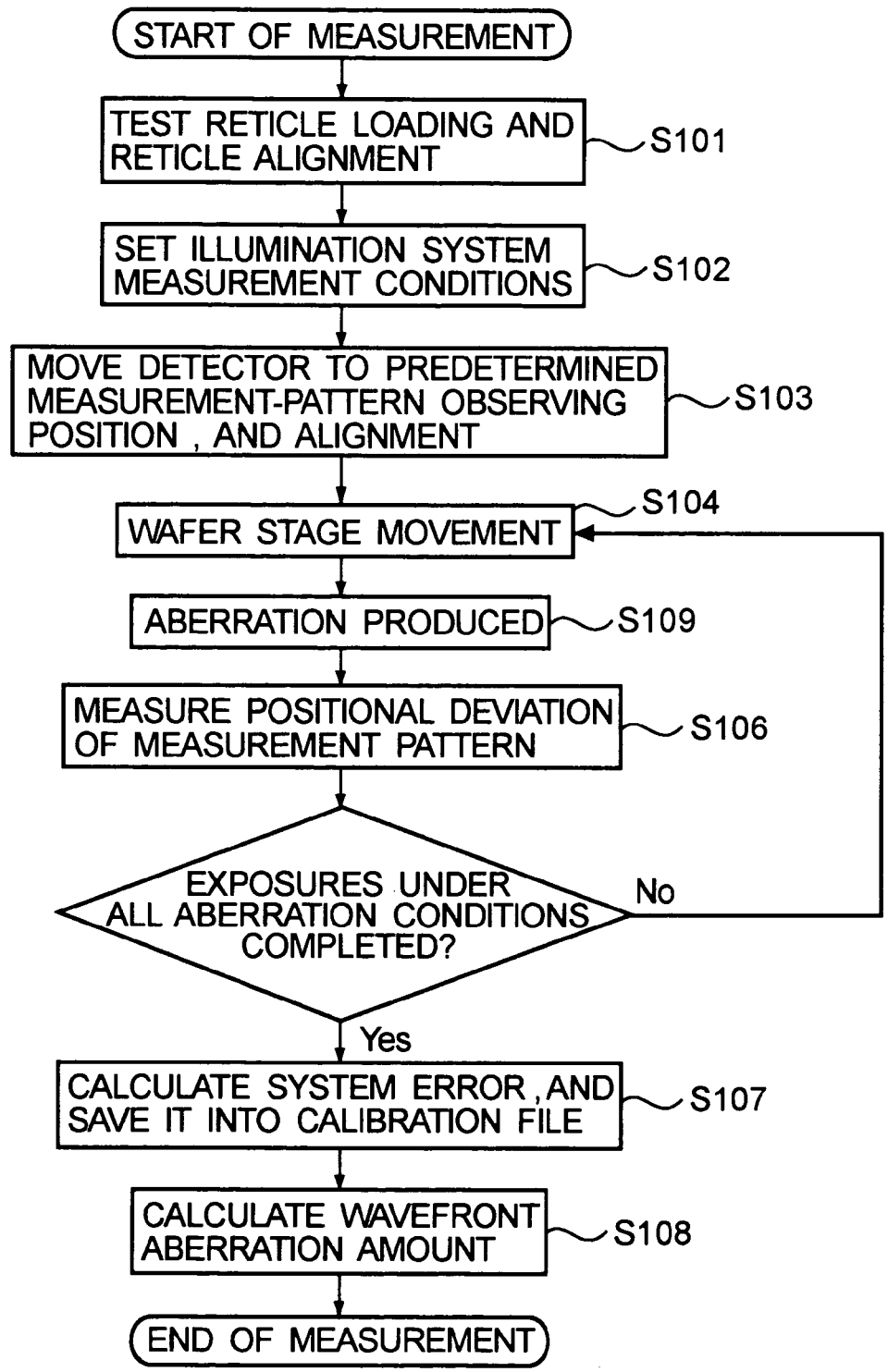
FIG. 14 is a flow chart for explaining another example of aberration measurement for a projection optical system, according to the present invention.

Alternatively, in place of changing the spherical aberration by changing the position of the plate 11a top surface with respect to the optical axis direction, the position of a lens 162 (FIG. 2) in the optical axis direction may be changed by lens driving means 161 to successively change a particular aberration, such as spherical aberration, coma aberration, astigmatism or field curvature by a predetermined amount, and the above-described wavefront aberration measurement may be carried out. Then, by using the computing means of FIG. 2, data such as shown in FIG. 12 that represents the interrelationship between the pupil plane positional deviation amount and the amount of change of aberration other than the particular aberration, caused with respect to the component that produced the aforementioned aberration, may be prepared. On the basis of this data, the pupil plane positional deviation amount with which other aberration can be minimized can be determined. FIG. 14 illustrates the sequential flow for detecting the positional deviation (error) of the pupil plane as a system error, described just above.

In the flow chart of FIG. 14, steps corresponding to those of FIG. 13 are denoted by similar references. In FIG. 14, in place of step S105 of FIG. 13, aberration production step S109 is added. That is, at step S109, a particular aberration is changed by a predetermined amount, and at step S106 a positional deviation amount of the measurement pattern is measured, whereby the amount of change of other aberration component as the particular aberration is changed by a predetermined amount can be calculated. Then, from the result of calculation, the positional deviation amount of the pupil plane is detected as a system error.

Next, an example of a method of calculating a positional deviation (system error) of the pupil plane center, to be carried out in computing means of the first embodiment or embodiments to be described later, will be explained. This method differs from the method having been described with reference to FIGS. 11 and 12.

$$W(x, y) = \sum kCk * Zk(x, y) \quad (1)$$

$$= \sum kCk' * Zk(x + dx, y + dy)$$

$$= \sum kCk' * \{Zk(x, y) + dx * \sum iGx(k, i) * Zi(x, y) + dy * \sum iGy(k, i) * Zi(x, y) + dxdy * \sum ...\}$$

where:
W(x,y) is wavefront aberration (x,y≦1) in pupil coordinates;
C is Zernike coefficient to be obtained, and k is Zernike term;
C' is Zernike coefficient as pupil deviation is present;
Z(x,y) is Zernike polynomial;
dx and dy are x- and y-pupil plane deviations;
Gx and Gy are Zernike matrix derived from dx and dy;

Under dx,dy<<one-condition:

$$\Sigma kCk'*\{Zk(x,y)+dx*\Sigma iGx(k,i)*Zi(x,y)+dy*\Sigma iGy(k,i) *Zi(x,y)\}=\Sigma k\{Ck'+dx*\Sigma iGx(i,k)*Ci'+dy*\Sigma iGy(i, k)*Ci'\}*Zk(x,y) \quad (2)$$

$$Ck=Ck'+dx*\Sigma iGx(i,k)*Ci'+dy*\Sigma iGy(i,k)*Ci' \quad (3)$$

The wavefront aberration W to be obtained can be expressed by the Zernike coefficient C as shown in equation (1). Where C' is the Zernike coefficient when actual pupil plane positional deviation (dx,dy) is produced, from equation (1), equation (2) can be obtained finally. Also, from equations (1) and (2), equation (3) applies. From equation (3), Ck to be obtained can be expressed by an equation using already measured and detected Ck' and other Ci (i=1, 2, 3, ...) and unknown quantities dx and dy. Here, Gx and Gy are matrix (not shown) corresponding to the Zernike terms that can be obtained by developing the Zernike polynomial with the product of dx and dy. Hence, as an example, by measuring Ci' while changing the position (focus) of the detector 11 in the optical axis direction or other aberration (spherical aberration, coma aberration, astigmatism, ...), as described hereinbefore, a plurality of Ci changing amounts ΔCi'j (j is a plurality of different conditions) relative to a change of particular aberration, can be obtained. Furthermore, in regard to those components ΔCp'j of the plurality of changing amounts ΔCi'j, with which no aberration change would inherently occur, optimum dx and dy that accomplish ΔCp'j=0 can be determined in accordance with the least square method. Thus, positional deviations (error) dx and dy of the pupil plane in X and Y directions can be detected. Since the least square method is known method in the art, description thereof will be omitted. The positional deviation or error (dx,dy) of the pupil plane detected in the above-described manner is memorized and stored into a calibration file of the computing means, for example, as a system error. The data can be used for wavefront aberration calculation using the same test reticle. Namely, it is used, substituting into equation (1).

The method of measuring positional deviation (error) of the pupil plane described above can be applied also to measurement other than the wavefront measurement having been described with reference to FIGS. 1 and 2. Specifically, it can be applied to improve a measurement error to be caused by a positional deviation of the pupil plane in the wavefront measurement method shown in U.S. Pat. Nos. 5,828,455 and 5,978,085 mentioned hereinbefore.

Next, a second embodiment of the present invention will be described. As compared with the first embodiment wherein the position of the image of the test pattern is detected by use of the detector 11 (photoelectric converting means) fixedly mounted on the wafer stage 12, in the second embodiment, an image of a test pattern is transferred to a photosensitive substrate (wafer) W and is developed such that, after visualizing the transferred test pattern image, the position of the transferred pattern image is detected by using a pattern position measuring machine or the like.

Figure 8:
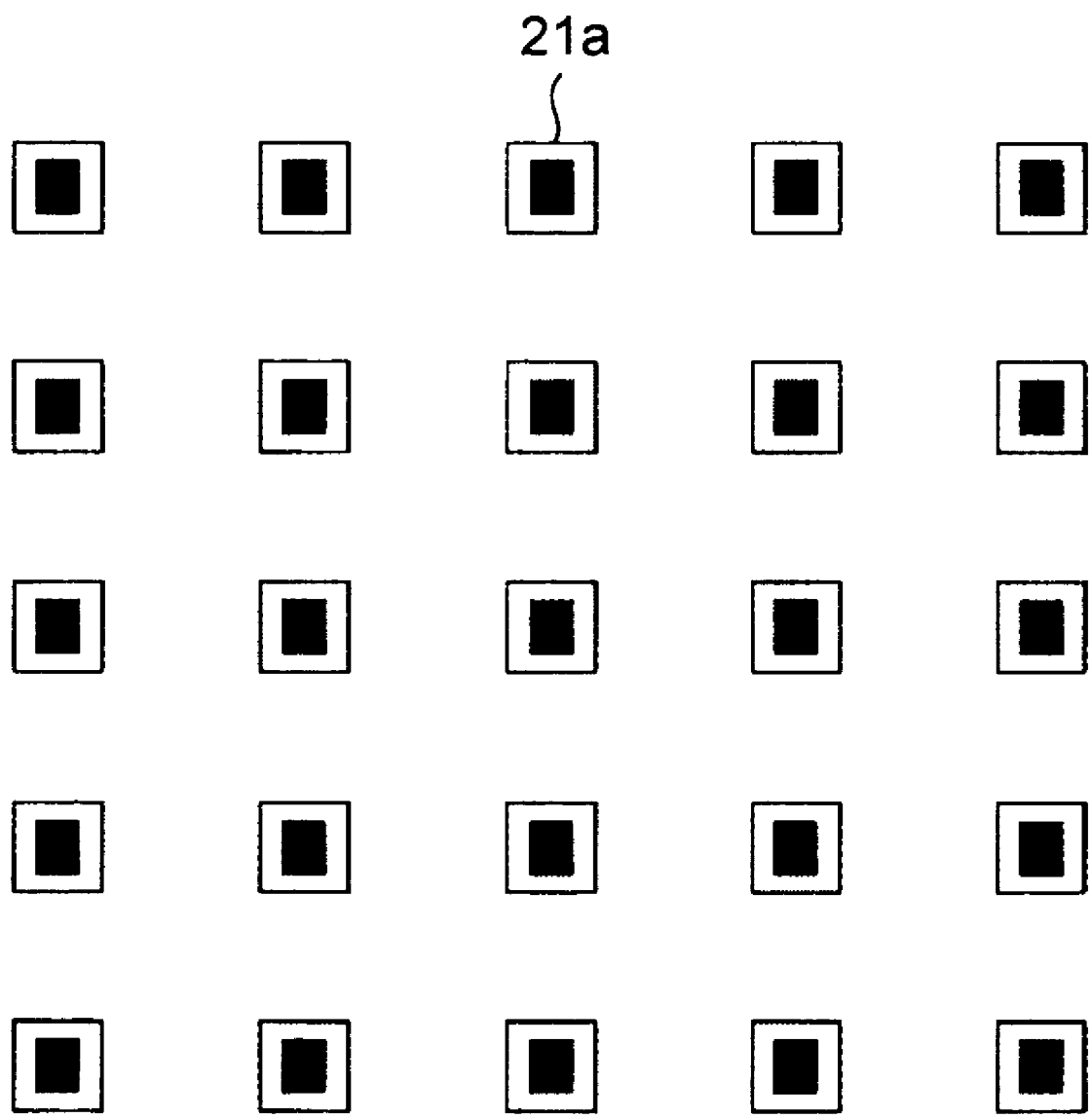
FIG. 8 is a schematic view of a reference grid which constitutes a test pattern according to the present invention.

In addition to the test pattern 15 shown in FIG. 7, the second embodiment uses a reference pattern such as shown in FIG. 8. Since the test pattern 15 of FIG. 7 and the reticle structure for illuminating the same have already been explained with reference to the first embodiment, they will not be described again here.

The reference pattern shown in FIG. 8 comprises a grid mark 21a constituted by a reference mark group in which a plurality of reference marks, for measuring relative positional deviations of the patterns PTX and PTY of the test pattern 15 described hereinbefore, are arrayed two-dimensionally. Above the test pattern 21a of the test reticle 9, there is no means such as light blocking film with pinhole, for restricting the light, so that all the light from the illumination system or from the alignment scope 19 is projected upon all the reference patterns uniformly.

Figure 10:
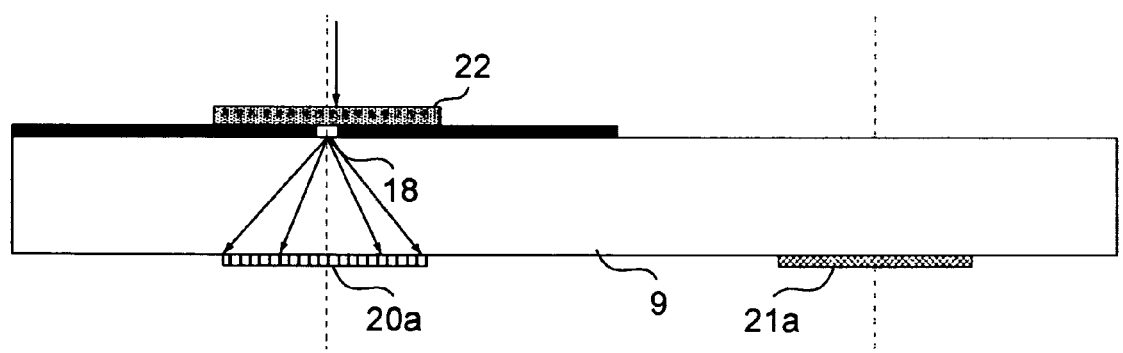
FIG. 10 is a sectional view for explaining another example of a test reticle according to the present invention.

FIG. 10 is a fragmentary and sectional view of the test reticle 9 used in the second embodiment. As shown in FIG. 10, on the top and bottom surfaces of a glass substrate of the test reticle 9, a light blocking film with a pinhole PH and test patterns 20a (15) and 21a are formed.

The marks 20a and 21a (test pattern) are illuminated under an optimum illumination condition with respect to the mark 20a, and images of these marks are exposed (transferred) onto a substrate W to be exposed. Subsequently, the wafer stage 20 is moved to change the position of the substrate W to be exposed, so that the exposure can be carried out with regard to a position not superposed with the exposure position of the preceding exposure. Also, the wafer stage 12 is moved in Z direction (optical axis direction), and at a predetermined focus position, the mark images are exposed (transferred) again to the substrate W to be exposed. This procedure is repeated with regard to plural and different focus positions.

Thereafter, the wafer stage 12 or the reticle stage 20 is moved so that the marks 20a and 21a having already been exposed and marks 21a and 20a to be exposed subsequently are superposed with each other, and under standard illumination condition, the marks 21a and 20a are exposed (transferred) to the substrate W to be exposed. The substrate W is then developed and, thereafter, a relative positional deviation amount between the transferred image of the patterns PTX and PTY of the mark 20a and the transferred pattern image of the grid mark 21a, as the transferred marks 20a and 21a being superposed, is measured by using a measuring device.

From the central position (deviation amount) of the transferred image of the patterns PTX and PTY thus obtained, the wavefront aberration can be measured like the foregoing embodiment and, additionally, positional deviation (error) dx and dy of the pupil plane is calculated and stored into a calibration file, for example, as a system error. This can be used for subsequent calculation of wavefront aberration, that is, by substituting into equation (1).

Figure 16:
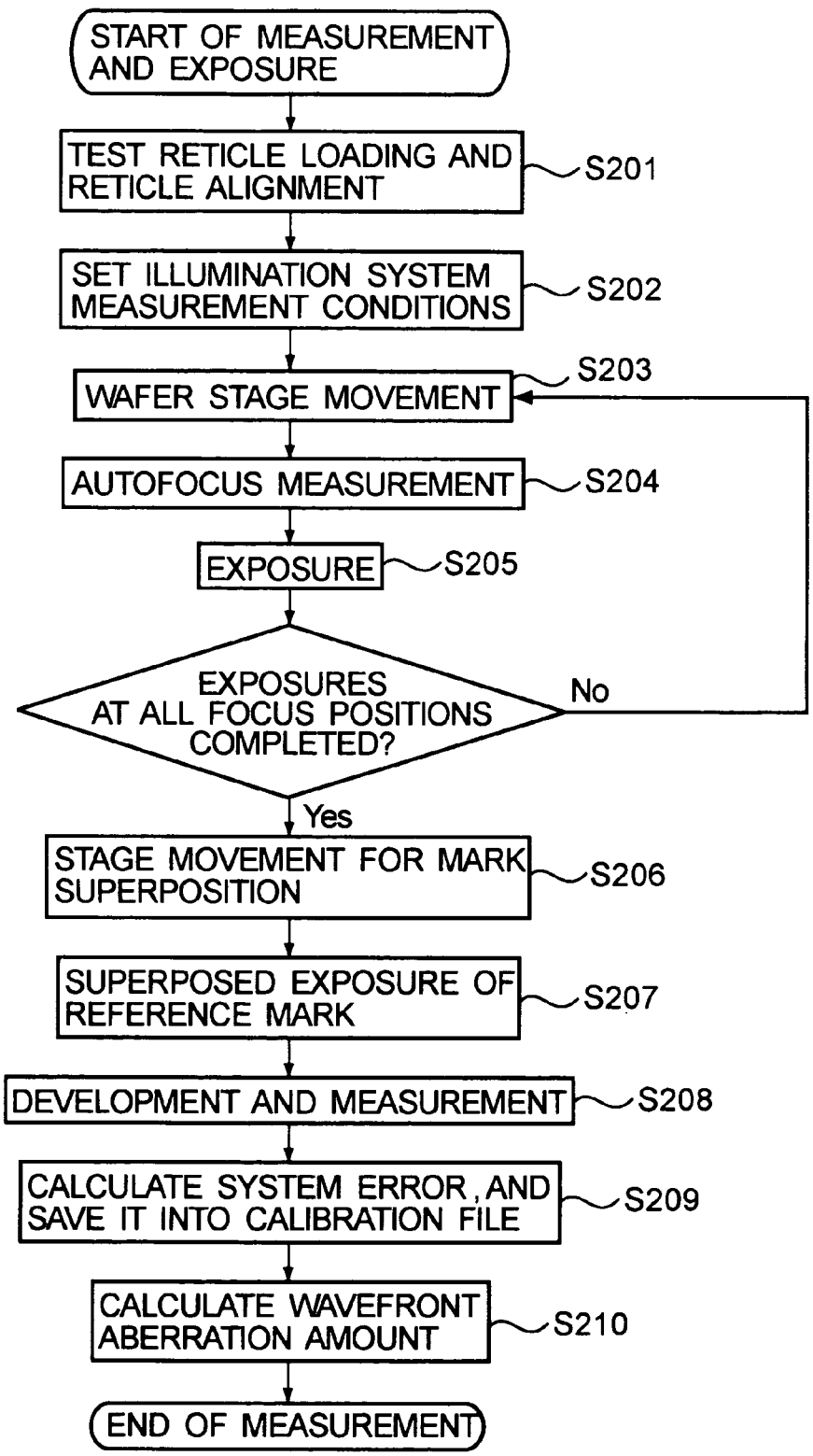
FIG. 16 is a flow chart for explaining a further example of aberration measurement for a projection optical system, according to the present invention.

FIG. 16 illustrates the measurement sequence described above.

Figure 15:
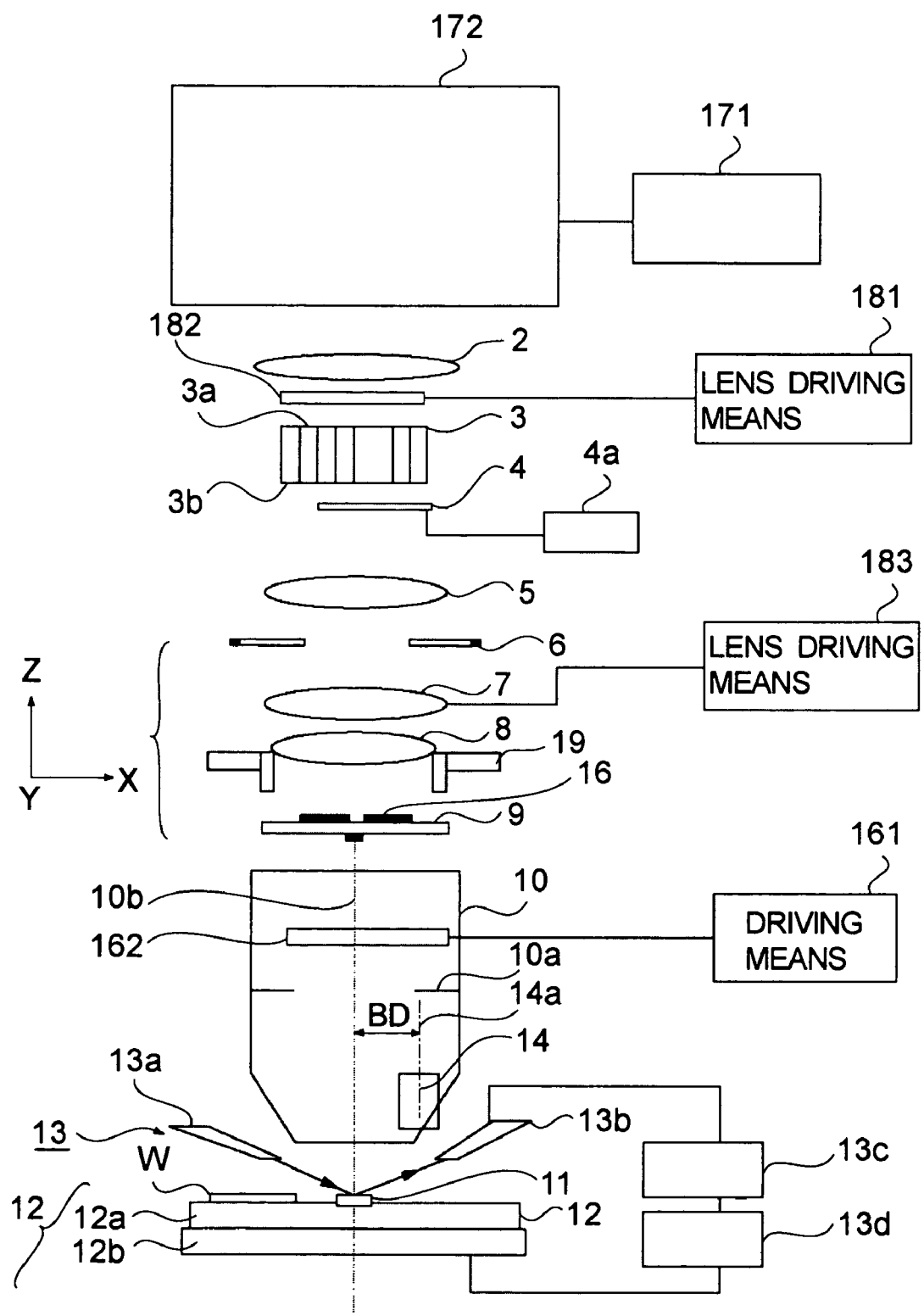
FIG. 15 is a schematic view of an exposure apparatus according to another embodiment of the present invention.
Figure 17:
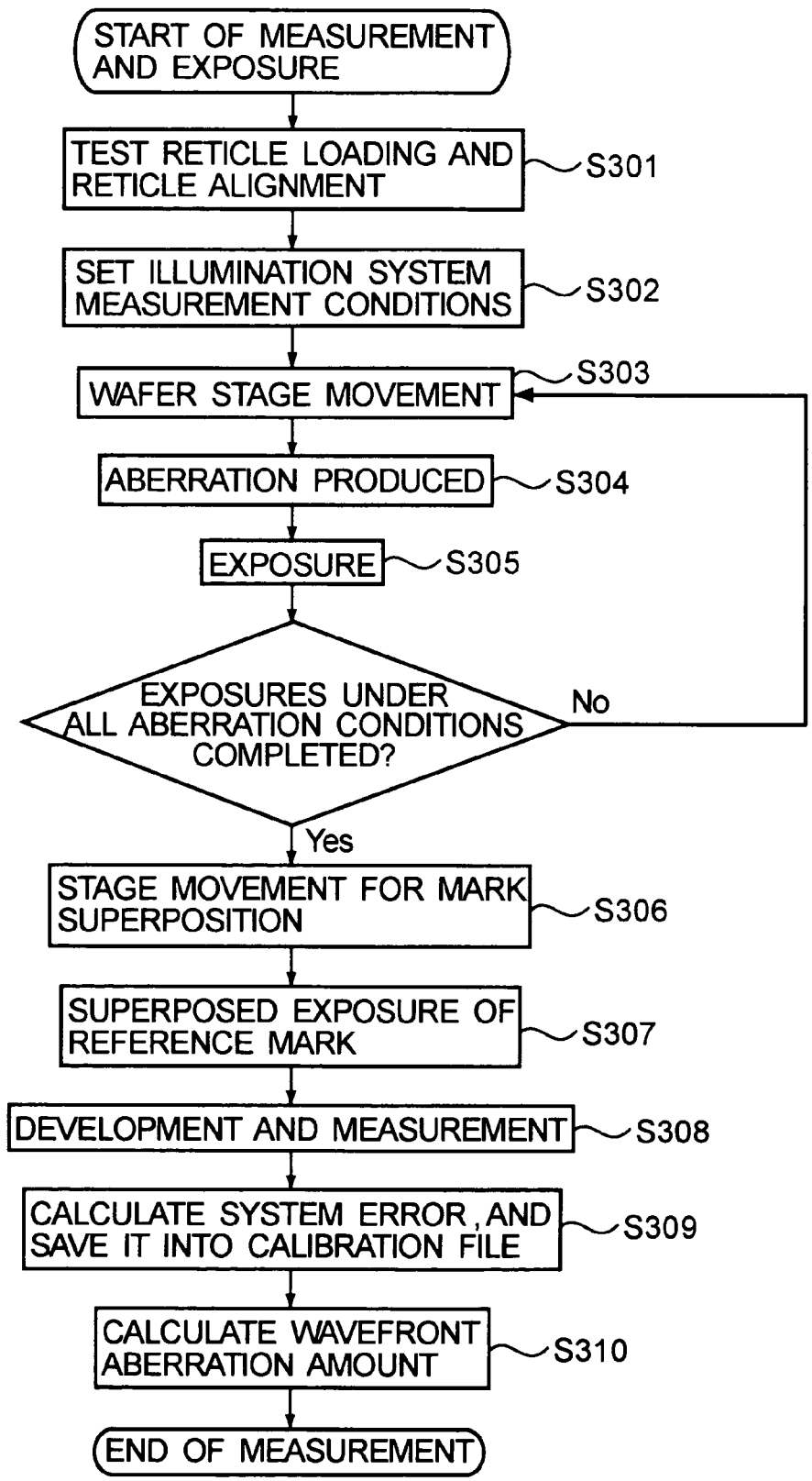
FIG. 17 is a flow chart for explaining a yet further example of aberration measurement for a projection optical system, according to the present invention.

In place of changing the position (focus position) of the substrate W in the optical axis direction, lens driving means 161, laser light source 172 or wavelength changing means 171 shown in FIG. 15 may be used to change the position of a lens 162 in the optical axis direction or to change the wavelength of laser light or, alternatively, to move the test reticle upwardly or downwardly, or to change the pressure in a space between lenses of the projection optical system, thereby to successively change a particular aberration of the projection optical system 10 such as spherical aberration, coma aberration or astigmatism, by a predetermined amount. By repeating the exposure, a transferred image of the patterns PTX and PTY of the mark 20a and a transferred image of the grid mark 21a can be obtained. FIG. 17 illustrates the measurement sequence described just above.

The method of measuring a positional deviation (error) of the pupil plane according to the second embodiment also is applicable to improve a measurement error to be caused by a positional deviation of the pupil plane in the wavefront measurement method shown in U.S. Pat. Nos. 5,828,455 and 5,978,085 mentioned hereinbefore.

In the first and second embodiments, the result of wavefront aberration measurement may be fed back to an aberration adjusting mechanism of the exposure apparatus main assembly, and in that occasion, aberration of the projection optical system can be corrected. As regards such adjusting mechanism, it may include the lens driving means 161 or laser wavelength changing means 171 shown in FIG. 15. Alternatively, the reticle may be moved upwardly or downwardly, or the pressure in a space between lenses of the projection optical system may be changed. The aberration of the projection optical system can be adjusted thereby.

Next, a third embodiment of the present invention will be described.

As another example of a method of measuring wavefront aberration of a projection optical system on the basis of measurement of a positional deviation of a test pattern image due to a projection optical system, there is a method such as disclosed in Japanese Laid-Open Patent Application No. 2002-55435 or "Aberration measurement using in-situ two beam interferometry", Optical Microlithography XIV, SPIE, vol. 4346, 2001, J. P. Kirk, IBM, et al.

Figure 18:
FIG. 18 is a schematic view, illustrating a mask mark.

According to this method, by measuring a phase difference between wavefronts passing through two locations on a pupil plane on the basis of two-beam interferometry, the optical characteristic of a projection optical system is detected. FIG. 18 shows an example of a test reticle usable in this method. The test reticle (mask) shown in FIG. 18 comprises a test pattern having a line-and-space mark. The space (transparent portion) of the mark has two different steps (levels), and they are so designed that the light beams passed through these steps have a phase difference of 90 deg. When this line-and-space mark is illuminated under standard smallσ illumination condition, diffraction light emitted from the line-and-space mark and impinging on the pupil plane of the projection optical system differs from zero-th order and ±1-st order diffraction lights to be provided by a standard line-and-space mark using binary mask. It comprises two light beams, that is, zero-th order diffraction light and positive first-order diffraction light or, alternatively, minus first order diffraction light. These lights pass through the projection optical system and, they interfere with each other and are imaged.

If the projection optical system 10 has wavefront aberration, the pattern image produced by the interference of the above-described two light beams is influenced by phases of portions of the wavefronts that the two light beams have passed, respectively. Here, if the two light beams have a phase difference, the position of the pattern image shifts from the idealistic position by an amount corresponding to the phase difference. Hence, by detecting the positional shift of the pattern image and the passage positions of the two light beams on the pupil plane, the phase difference between the wavefronts of the light beams can be detected.

Figure 19:
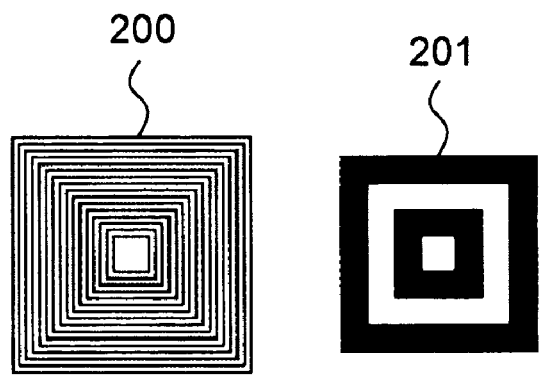
FIG. 19 is a schematic view, illustrating mask marks.

Alternatively, by changing the pitch of the line-and-space mark or by rotating the mark itself, the angle or directions of two diffraction lights can be changed. Namely, phase differences at various wavefront portions in which the pupil plane passage position is different, can be detected. FIG. 19 illustrates an example of such test mark.

In FIG. 19, a left-hand mark 200 and a right-hand mark 201 are exposed superposedly, so that only a portion of the mark 200 remains in box-to-box shape, that is, a shape in which a positional deviation between an inside box and an outside box can be measured. Then, it is measured by using a measuring machine of known type. Details of such boxy mark are disclosed in Japanese Laid-Open Patent Application No. 2002-55435 and corresponding U.S. Published Patent Application No. 2002/021434.

From the phase difference information regarding the wavefront at various locations on the pupil plane having been obtained in accordance with the method described above, the optical characteristic of the projection optical system itself can be calculated. However, like the measurement methods discussed with reference to the preceding embodiments or disclosed in the U.S. Patents mentioned hereinbefore, the optical characteristic measuring method disclosed in Japanese Laid-Open Patent Application No. 2002-55435 and corresponding U.S. Published Patent Application No. 2002/021434 involves a possibility of system error due to a positional deviation of the pupil plane.

As regards a factor for the system error in this case, it may be a matching error between the telecentricity on the reticle side of the illumination system and the telecentricity on the reticle side of the projection optical system. Although there is a difference in the point of presence of influence of the telecentricity of the illumination system, the system error can be measured in the manner as has been described with reference to the preceding embodiments.

Figure 21:
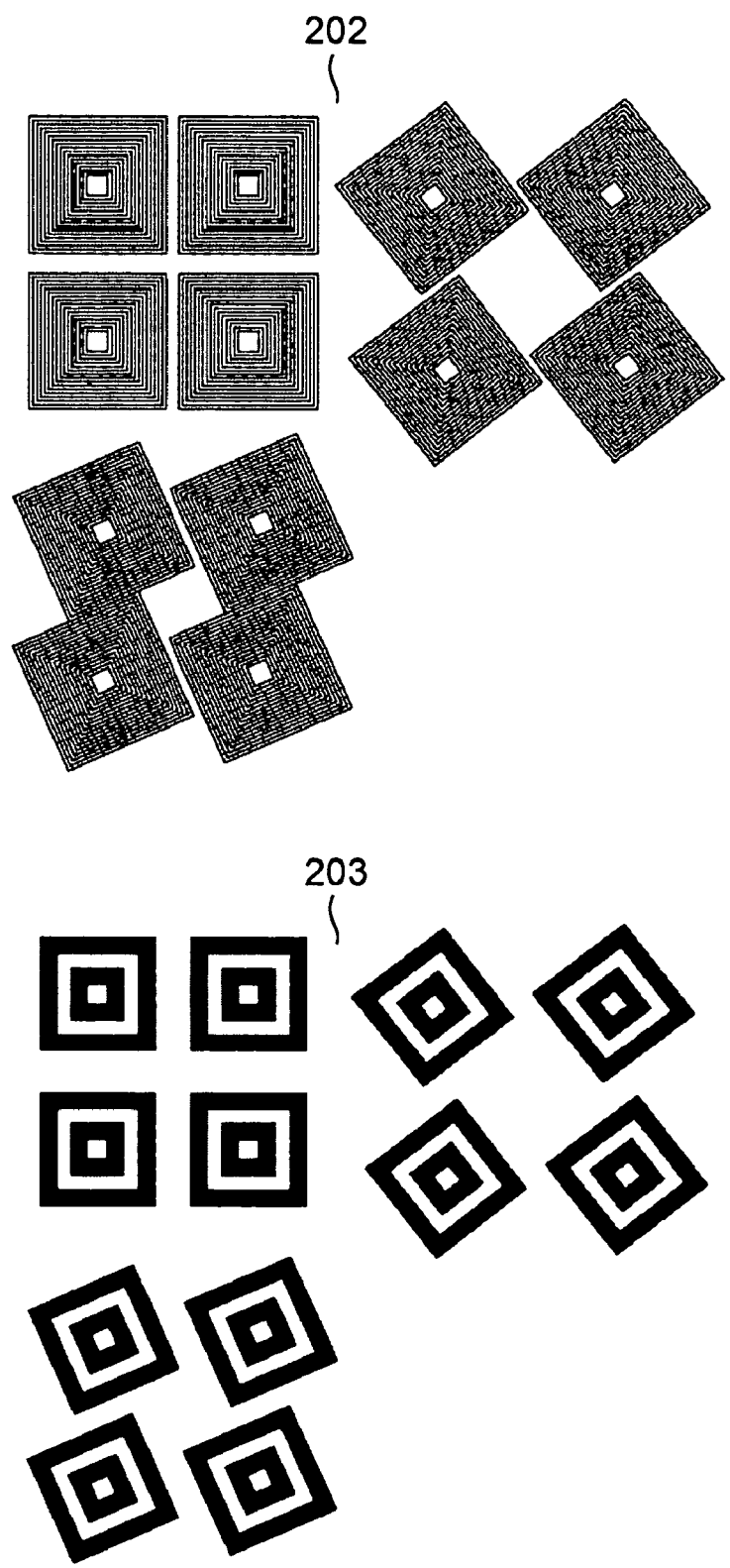
FIG. 21 is a schematic view, illustrating mask marks.

In the third embodiment, the mark groups 202 and 203 shown in FIG. 21 are exposed (transferred) to the substrate to be exposed, under small-σ illumination condition. The mark group 202 comprises a set of marks having the same shape as the mark 200 of FIG. 19, but the pitch of them and the rotational angle of each mark itself are mutually different. That is, a plurality of marks are collected and disposed inside a region that can be regarded as one image height. On the other hand, the mark group 203 comprises a set of marks having the same shape as the mark 201 of FIG. 19, but pitch of them and the rotational angle of each mark itself are made mutually different in accordance with the marks of the mark group 202.

The positional relation in the plural marks of the mark group 202 is the same as the positional relation in the plural marks of the mark group 203.

Subsequently, the wafer stage 12 is moved to move the substrate W to be exposed to another location and, additionally, the wafer stage 12 is moved in the optical axis direction of the projection optical system 10 thereby to set the substrate to be exposed, at a predetermined height. Then, under standard small-σ illumination condition, the mark groups 202 and 203 are again exposed (transferred) to the substrate W. This procedure is repeated with respect to different defocus positions.

Figure 20:
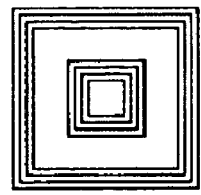
FIG. 20 is a schematic view, illustrating a measurement mark.

Subsequently, as has been described with reference to FIG. 20, the wafer stage 12 or the reticle stage 20 is moved so that the mark groups 202 and 203 are exposed superposedly, and exposures of the marks 202 and 203 are repeated under standard small-σ illumination condition. After a development process carried out, a relative positional deviation amount in the superposition of the mark groups 200 and 201 in which paired marks have been transferred as shown in FIG. 20, is measured in reference to each mark pair, by using a measuring machine. From the obtained positional deviations, the wavefront aberration is measured. Simultaneously, the positional deviation amount (error) of the pupil plane is calculated, and it is stored into a calibration file or the like as a system error. The thus stored positional deviation amount can be used in the wavefront aberration measurement for the projection optical system, for calculation of the wavefront aberration, that is, by substituting into equation (1).

Figure 22:
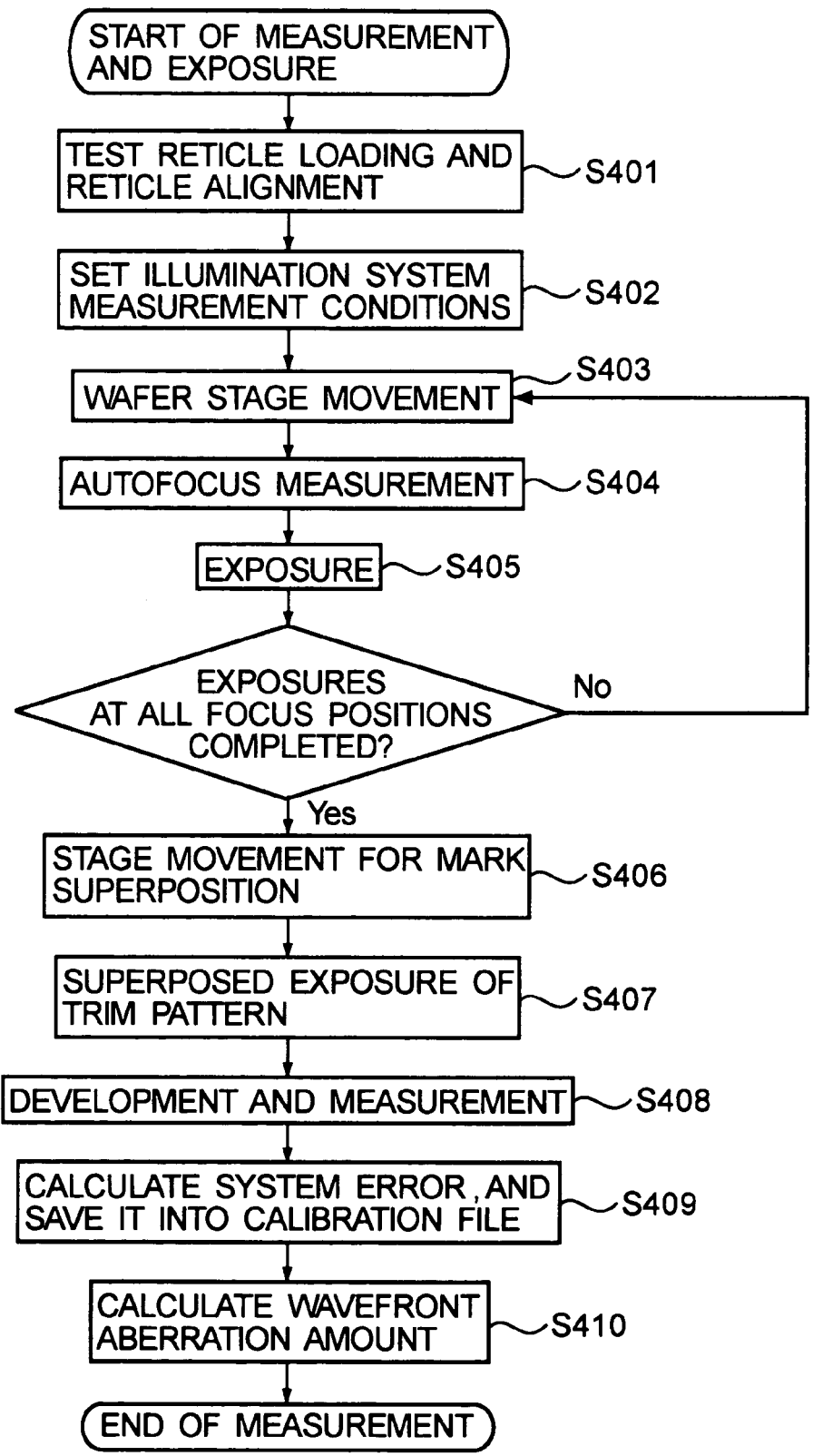
FIG. 22 is a flow chart for explaining a further example of aberration measurement for a projection optical system, according to the present invention.

FIG. 22 illustrates the measurement sequence described just above.

Figure 23:
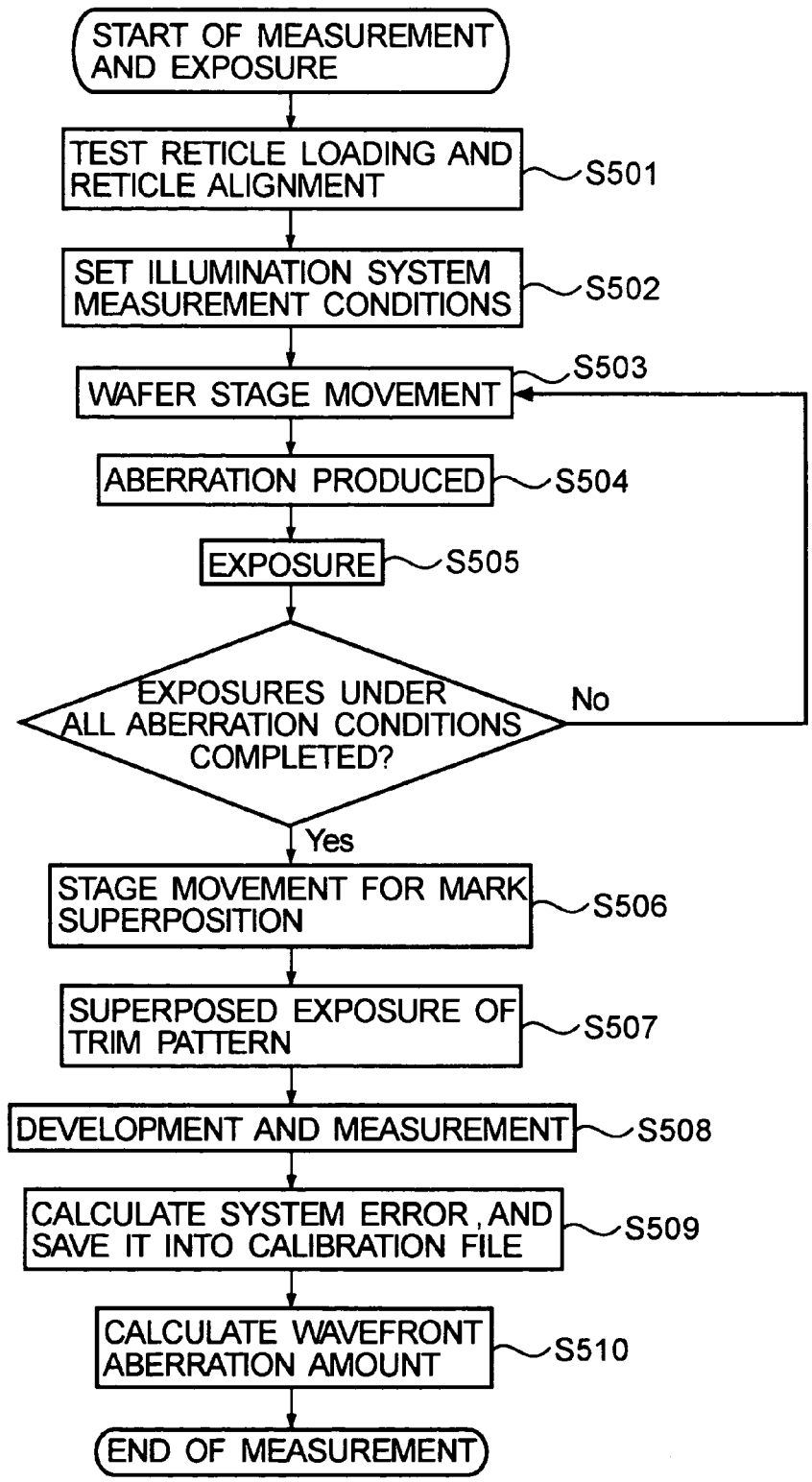
FIG. 23 is a flow chart for explaining a still further example of aberration measurement for a projection optical system, according to the present invention.

In the third embodiment, too, in place of changing the position of the substrate W in the optical axis direction, the lens driving means 161 or wavelength changing means 171 shown in FIG. 15 may be used to successively change a particular aberration of the projection optical system 10 by a predetermined amount. After repeating the mark exposure and after the development, the wavefront aberration may be measured in the similar manner as described hereinbefore and, simultaneously, a positional deviation amount (error) of the pupil plane may be calculated and stored into a calibration file or the like as a system error. The thus stored positional deviation amount can be used in the wavefront aberration measurement for the projection optical system, for calculation of the wavefront aberration. FIG. 23 illustrates the measurement sequence described just above.

Figure 24A:
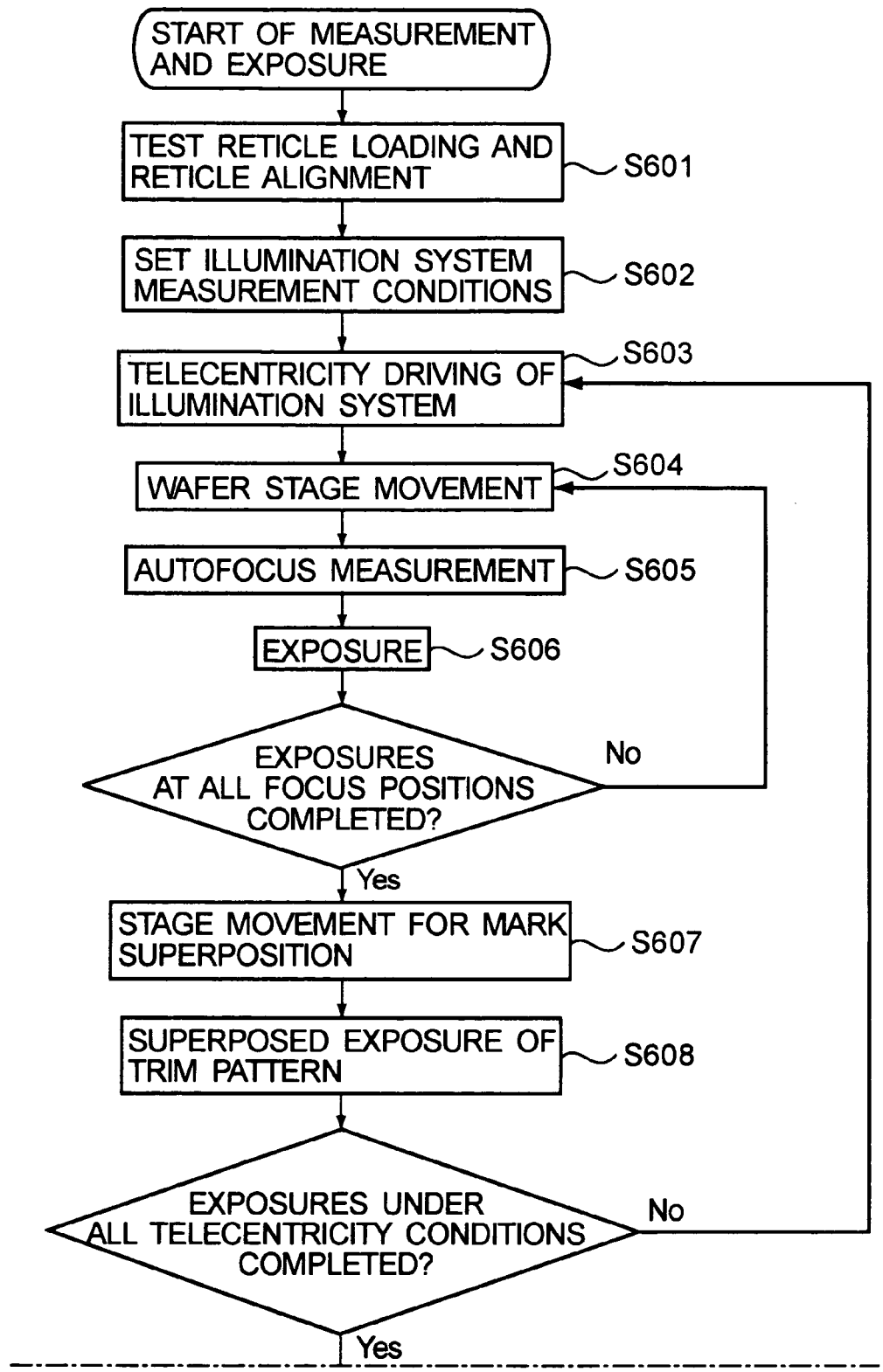
FIG. 24 is a flow chart for explaining a yet further example of aberration measurement for a projection optical system, according to the present invention.
Figure 24B:
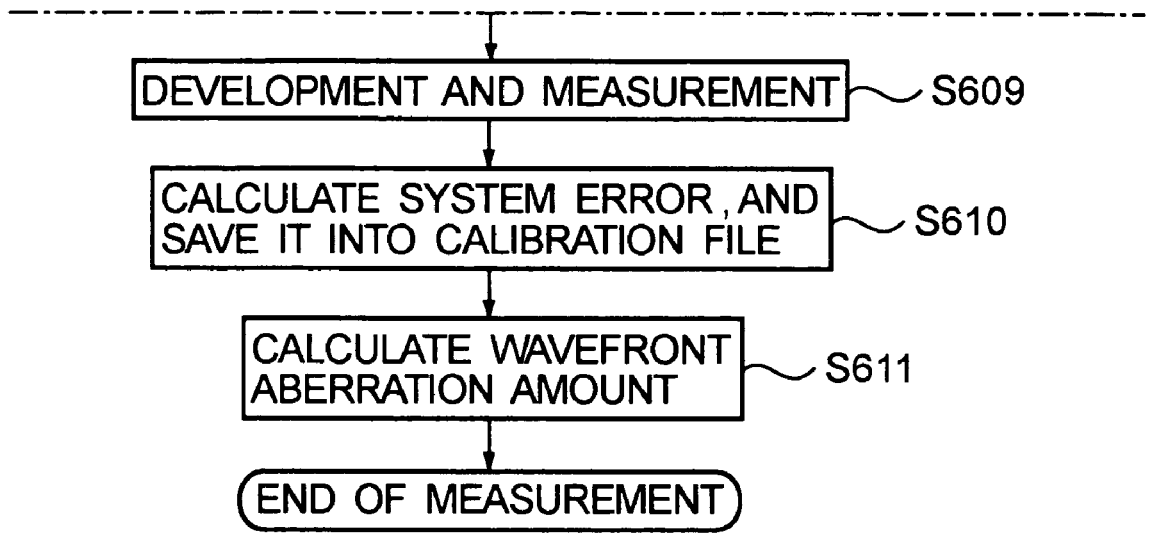
Figure 24:
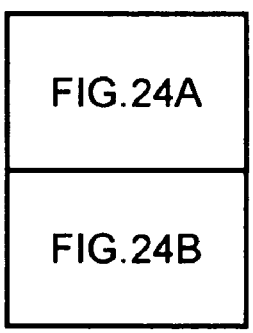
Figure 25A:
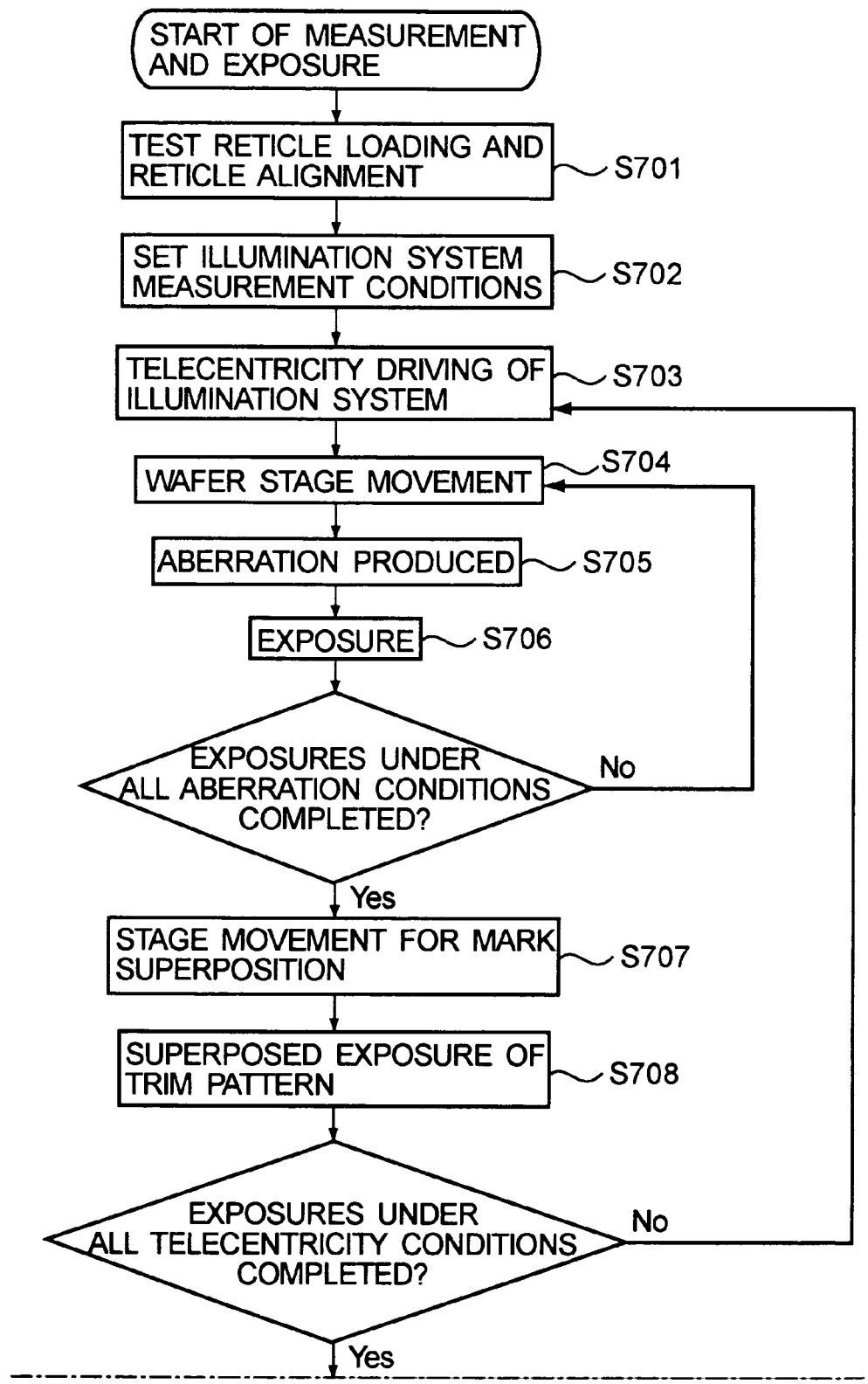
FIG. 25 is a flow chart for explaining a yet further example of aberration measurement for a projection optical system, according to the present invention.
Figure 25B:
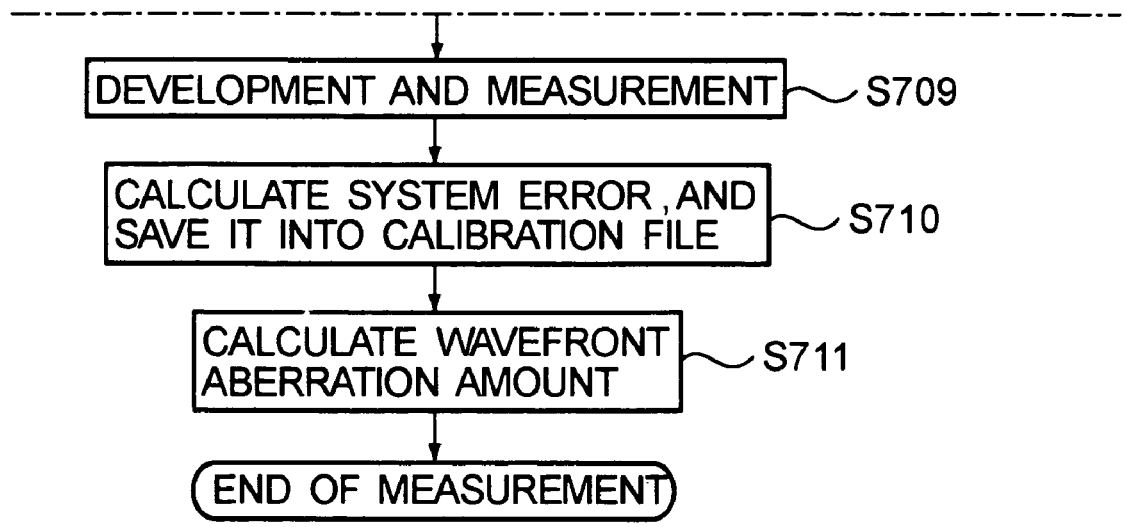
Figure 25:
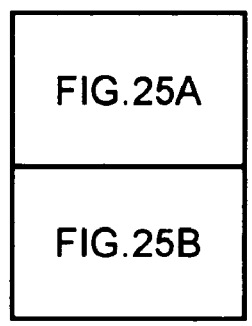

In addition to the methods described above, the telecentricity on the reticle side of the illumination system may be changed by using lens driving means 181 and 183 of the illumination system and, simultaneously, exposure may be carried out while changing the height of the substrate W or successively changing a particular aberration by a predetermined amount. In that occasion, by performing measurement and analysis, the telecentricity of the illumination system with which a change in wavefront aberration attributable to a change in height (defocus change) of the substrate or to a change in the produced amount of particular aberration becomes smallest, can be directly detected. FIG. 24 illustrates the measurement sequence in relation to the substrate height change, and FIG. 25 illustrates the measurement sequence with reference to the particular aberration change.

In the third embodiment, like the first and second embodiments, the result of wavefront aberration measurement may be fed back to an aberration adjusting mechanism of the exposure apparatus main assembly, by which correction of aberration of the projection optical system is enabled. As regards such adjusting mechanism, it may include the lens driving means 161 or laser wavelength changing means 171 shown in FIG. 1 or 15. Alternatively, the reticle may be moved upwardly or downwardly, or the pressure in a space between lenses of the projection optical system may be changed. The aberration of the projection optical system can be adjusted thereby.

It should be noted here that the optical characteristic measuring method of the present invention has no dependency upon the types of projection optical systems, and it can be applied to measure wavefront aberration of various types of projection optical systems. For example, the wavefront aberration measurement can be applied to a projection optical system constituted only by transparent optical elements such as lenses and diffraction gratings, a projection optical system having a concave mirror and lenses, and a projection optical system all of or most of the component of which are mirrors, including concave mirror and convex mirrors.

While the invention has been described with reference to the structures disclosed herein, it is not confined to the details set forth and this application is intended to cover such modifications or changes as may come within the purposes of the improvements or the scope of the following claims.

What is claimed is:

1. A method of measuring an optical characteristic of an optical system, said method comprising:
a first detecting step for causing each of plural light beams from a pattern to pass a predetermined position on a pupil plane of the optical system and subsequently imaging the light beams separately, and for detecting an imaging position of each light beam upon the pupil plane of the optical system;
a second detecting step for detecting error information related to a position of the pupil plane, along the pupil plane; and
a third detecting step for detecting wavefront aberration of the optical system on the basis of the imaging position of each light beam upon the pupil plane and of the error information.

2. A method of measuring an optical characteristic of an optical system, said method comprising:
a first detecting step for causing each of plural light beams from a pattern to pass through a pupil plane of the optical system and subsequently causing the light beams to interfere with each other and imaging them, and for detecting an imaging position upon the pupil plane of the optical system;
a second detecting step for detecting error information related to a position of the pupil plane, along the pupil plane; and
a third detecting step for detecting wavefront aberration of the optical system on the basis of the imaging position of each light beam upon the pupil plane and of the error information.

3. An apparatus for measuring an optical characteristic of an optical system, said apparatus comprising:
position detecting means for detecting, when each of plural light beams from a pattern passes a predetermined position on a pupil plane of the optical system and the light beams are subsequently imaged separately, an imaging position of each light beam upon the pupil plane of the optical system;
storing means for storing error information related to a position of the pupil plane, along the pupil plane; and
calculating means for calculating wavefront aberration of the optical system on the basis of a result of detection made by said position detecting means and the error information stored in said storing means.

4. An apparatus according to claim 3, wherein said position detecting means detects the imaging position of each light beam under different conditions which differ from each other in respect to the state of generation of a predetermined aberration of the optical system, and wherein said storing means stores error information obtained on the basis of results of detections made under the different conditions.

5. An apparatus according to claim 4, wherein the predetermined aberration is at least one of spherical aberration, coma aberration and astigmatism.

6. An apparatus according to claim 4, wherein the different conditions are established by performing at least one of i) changing a position of photoelectric converting means, for detecting the imaging position, or of a wafer coated with a resist, in an optical axis direction of the optical system, ii) changing a wavelength of light for imaging the pattern, and iii) moving an optical element of the optical system.

7. An apparatus according to claim 3, wherein the pattern comprises a substrate having a mark group formed in a region which can be regarded as one image height, and a light blocking plate having a pinhole formed at a position corresponding to a center of the region of the substrate, and wherein said light blocking plate is disposed between the substrate and the optical system.

8. An apparatus according to claim 3, wherein the pattern comprises a substrate having a mark group formed in a region which can be regarded as one image height, and a light blocking plate having a pinhole formed at a position corresponding to a center of the region of the substrate, wherein said light blocking plate is disposed at a light entrance side of the substrate and wherein each of marks constituting the mark group is provided by a grid pattern arranged so that substantially only zero-th order light can pass through the pupil plane.

9. An apparatus for measuring an optical characteristic of an optical system, said apparatus comprising:
position detecting means for detecting, when each of plural light beams from a pattern passes through a pupil plane of the optical system and the light beams subsequently interfere with each other and are imaged, an imaging position of each light beam upon the pupil plane of the optical system;

storing means for storing error information related to a position of the pupil plane, along the pupil plane; and calculating means for calculating wavefront aberration of the optical system on the basis of a result of detection made by said position detecting means and the error information stored in said storing means.

10. An apparatus according to claim 9, wherein said position detecting means detects the imaging position of each light beam under different conditions which differ from each other in respect to the state of generation of a predetermined aberration of the optical system, and wherein said storing means stores error information obtained on the basis of results of detections made under the different conditions.

11. An apparatus according to claim 10, wherein the predetermined aberration is at least one of spherical aberration, coma aberration and astigmatism.

12. An apparatus according to claim 10, wherein the different conditions are established by performing at least one of i) changing a position of photoelectric converting means, for detecting the imaging position, or of a wafer coated with a resist, in an optical axis direction of the optical system, ii) changing a wavelength of light for imaging the pattern, and iii) moving an optical element of the optical system.

13. An apparatus according to claim 9, wherein the pattern comprises a substrate having a mark group formed in a region which can be regarded as one image height, and a light blocking plate having a pinhole formed at a position corresponding to a center of the region of the substrate, and wherein said light blocking plate is disposed between the substrate and the optical system.

14. An apparatus according to claim 9, wherein the pattern comprises a substrate having a mark group formed in a region which can be regarded as one image height, and a light blocking plate having a pinhole formed at a position corresponding to a center of the region of the substrate, wherein said light blocking plate is disposed at a light entrance side of the substrate, and wherein each of marks constituting the mark group is provided by a grid pattern arranged so that substantially only zero-th order light can pass through the pupil plane.

15. An exposure apparatus, comprising:

a projection optical system for projecting a pattern of an original onto a substrate;

position detecting means for detecting, when each of plural light beams from a pattern passes a predetermined position on a pupil plane of the projection optical system and the light beams are subsequently imaged separately, an imaging position of each light beam upon the pupil plane of the projection optical system;

storing means for storing error information related to a position of the pupil planet along the pupil plane; and calculating means for calculating wavefront aberration of the projection optical system on the basis of a result of detection made by said position detecting means and the error information stored in said storing means.

16. A device manufacturing method, comprising the steps of:

exposing a wafer with a device pattern of an original through a projection optical system; and developing the exposed wafer;

wherein wavefront of the projection optical system is measured by use of an optical characteristic measuring apparatus which comprises i) position detecting means for detecting, when each of plural light beams from a pattern passes a predetermined position on a pupil plane of the optical system and the light beams are subsequently imaged separately, an imaging position of each light beam upon the pupil plane of the optical system, ii) storing means for storing error information related to a position of the pupil plane, along the pupil plane, and iii) calculating means for calculating wavefront aberration of the optical system on the basis of a result of detection made by said position detecting means and the error information stored in said storing means.

* * * * *